(12) United States Patent
Tappan

(10) Patent No.: US 8,900,404 B2
(45) Date of Patent: Dec. 2, 2014

(54) PLASMA PROCESSING SYSTEMS WITH MECHANISMS FOR CONTROLLING TEMPERATURES OF COMPONENTS

(75) Inventor: James Tappan, Fremont, CA (US)

(73) Assignee: Lam Research Corporation, Fremont, CA (US)

( * ) Notice: Subject to any disclaimer, the term of this patent is extended or adjusted under 35 U.S.C. 154(b) by 1474 days.

(21) Appl. No.: 12/468,670

(22) Filed: May 19, 2009

(65) Prior Publication Data

US 2009/0301657 A1 Dec. 10, 2009

Related U.S. Application Data

(60) Provisional application No. 61/060,439, filed on Jun. 10, 2008.

(51) Int. Cl.
| | |
|---|---|
| *C23C 16/00* | (2006.01) |
| *C23C 16/50* | (2006.01) |
| *C23F 1/00* | (2006.01) |
| *H01L 21/306* | (2006.01) |
| *H01J 37/32* | (2006.01) |

(52) U.S. Cl.
CPC ..... *H01J 37/32568* (2013.01); *H01J 37/32522* (2013.01); *H01J 37/32623* (2013.01)
USPC ............ 156/345.43; 118/729; 156/345.54

(58) Field of Classification Search
CPC .................................................. C23C 16/4586
USPC ................ 118/728–733; 156/345.51–345.55
See application file for complete search history.

(56) References Cited

U.S. PATENT DOCUMENTS

| | | | | |
|---|---|---|---|---|
| 4,034,616 A | * | 7/1977 | Rauscher | 474/174 |
| 4,618,334 A | * | 10/1986 | Miranti, Jr. | 474/93 |
| 5,835,334 A | * | 11/1998 | McMillin et al. | 361/234 |
| 7,128,806 B2 | * | 10/2006 | Nguyen et al. | 156/345.51 |
| 2003/0154922 A1 | | 8/2003 | House | |
| 2005/0070388 A1 | * | 3/2005 | Miyata et al. | 474/199 |
| 2006/0180968 A1 | * | 8/2006 | Kim et al. | 269/51 |
| 2007/0218197 A1 | | 9/2007 | Kurono | |

FOREIGN PATENT DOCUMENTS

KR 10- 782380 B1 12/2007

OTHER PUBLICATIONS

"International Preliminary Report on Patentability", Issued in PCT Application No. PCT/US2009/046931; Mailing Date Dec. 23, 2010.
"International Search Report", Issued in PCT Application No. PCT/US2009/046931; Mailing Date: Jan. 27, 2010.
"PCT Written Opinion",Issued in PCT Application No. PCT/US2009/046931; Mailing Date: Jan. 27, 2010.

* cited by examiner

*Primary Examiner* — Maureen Gramaglia
*Assistant Examiner* — Tiffany Nuckols
(74) *Attorney, Agent, or Firm* — Beyer Law Group LLP

(57) ABSTRACT

A plasma processing system with improved component temperature control is disclosed. The system may include a plasma processing chamber having a chamber wall. The system may also include an electrode disposed inside the plasma processing chamber. The system may also include a support member disposed inside the plasma processing chamber for supporting the electrode. The system may also include a support plate disposed outside the chamber wall. The system may also include a cantilever disposed through the chamber wall for coupling the support member with the support plate. The system may also include a lift plate disposed between the chamber wall and the support plate. The system may also include thermally resistive coupling mechanisms for mechanically coupling the lift plate with the support plate.

16 Claims, 19 Drawing Sheets

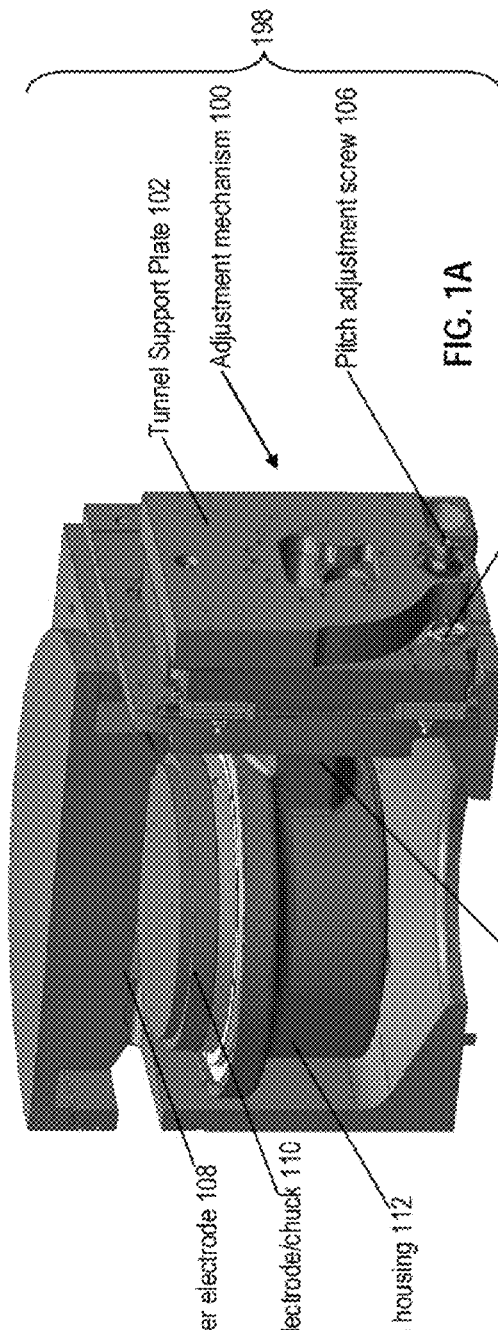
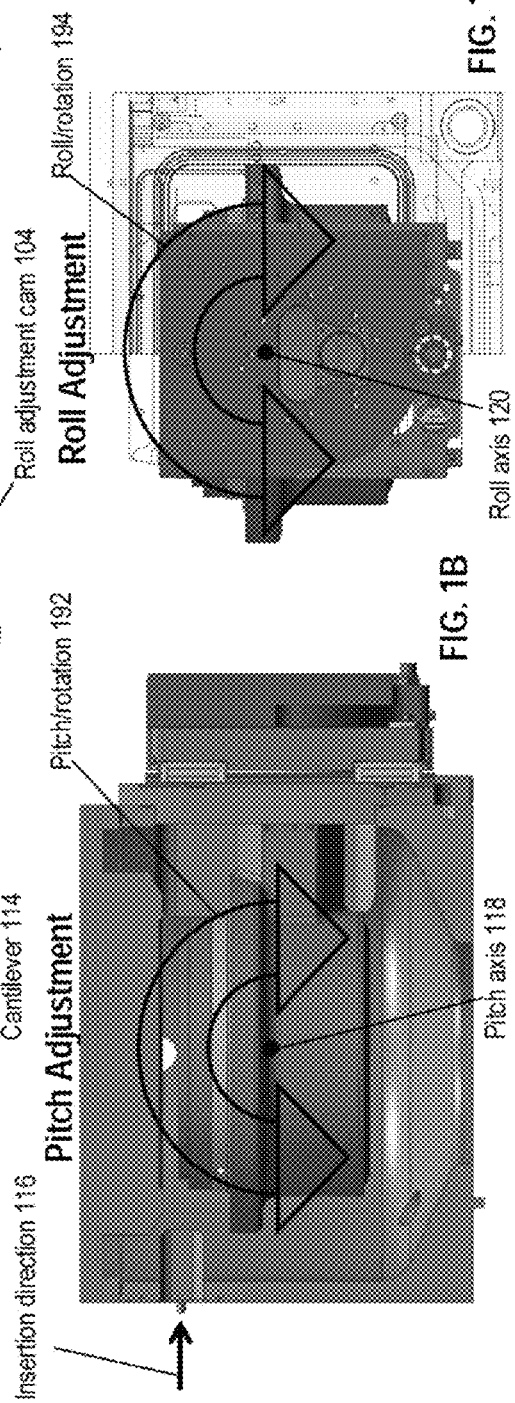
FIG. 1A
FIG. 1B
FIG. 1C

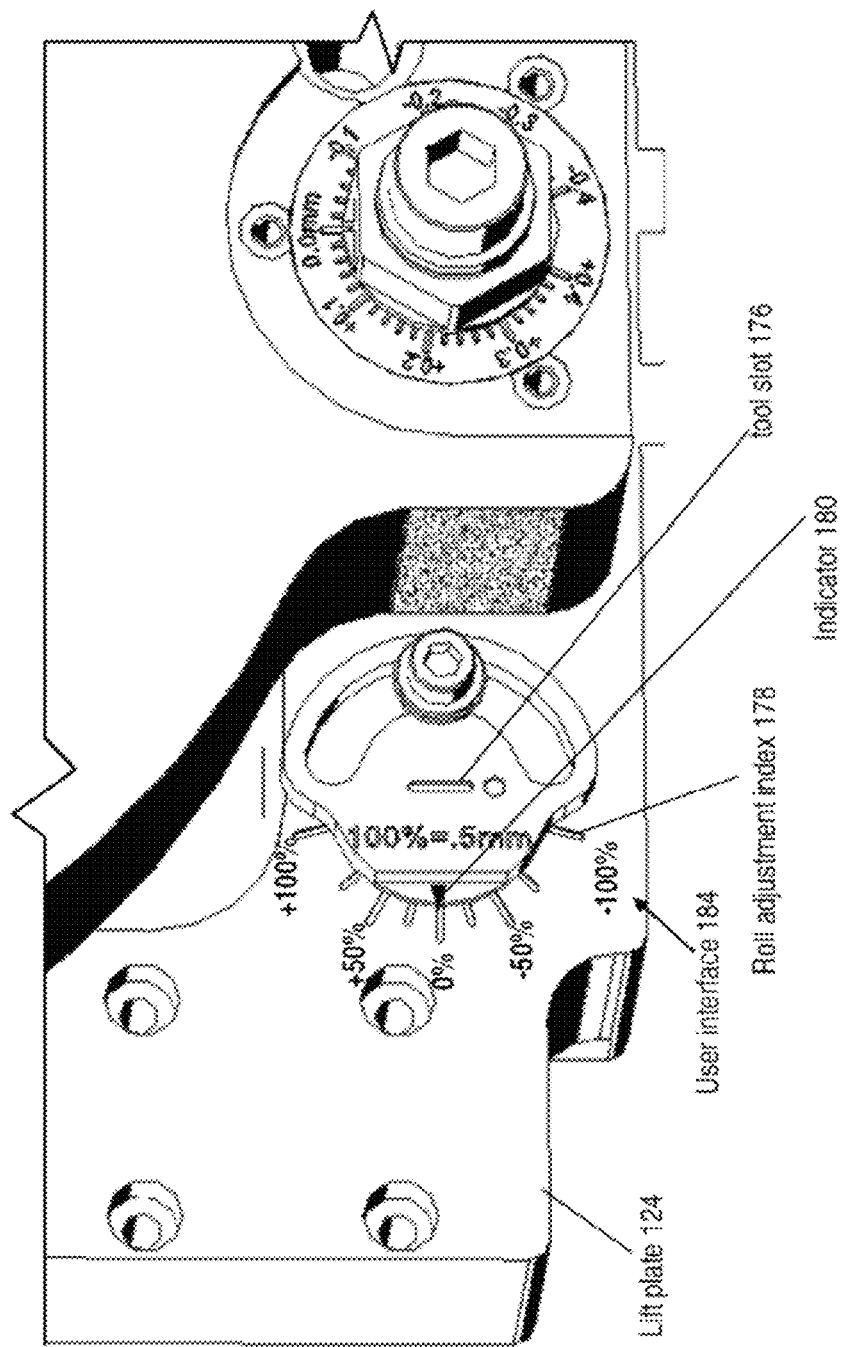

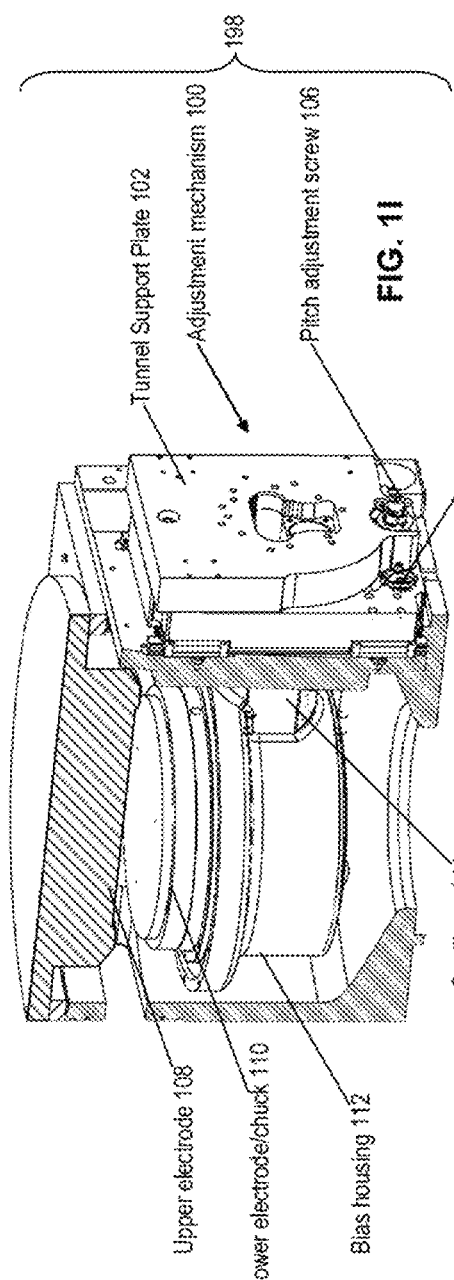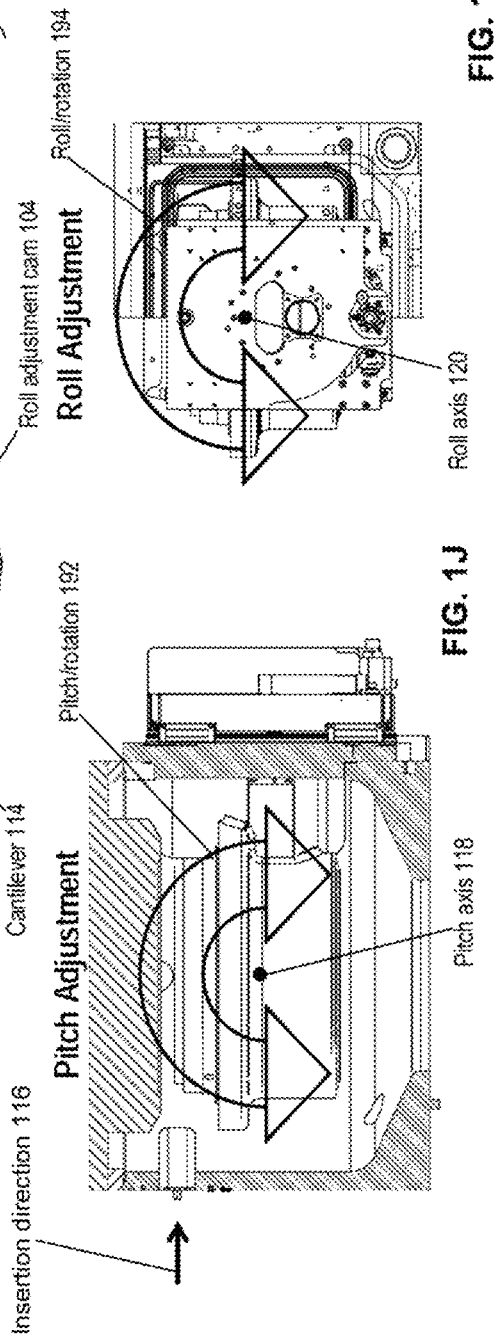

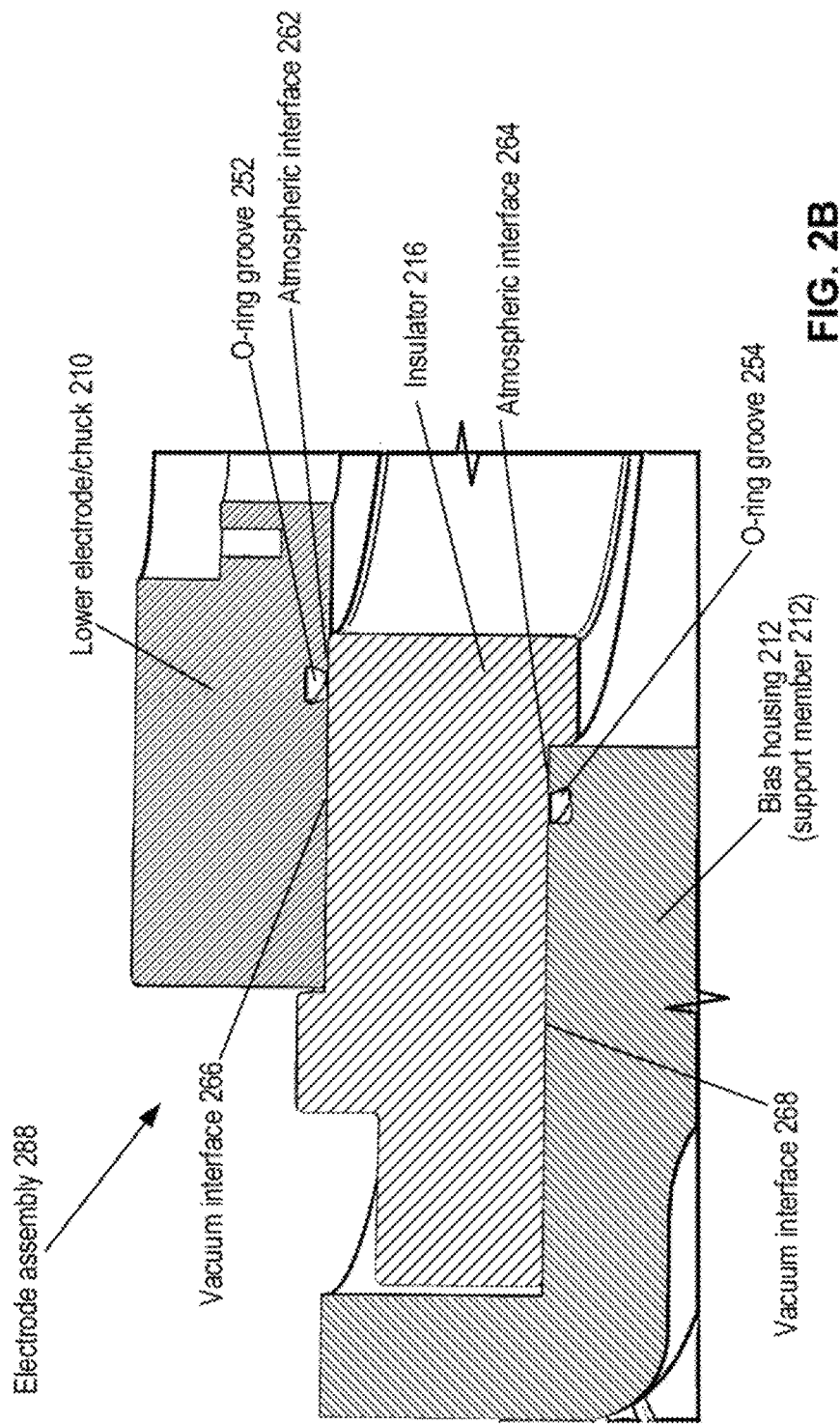

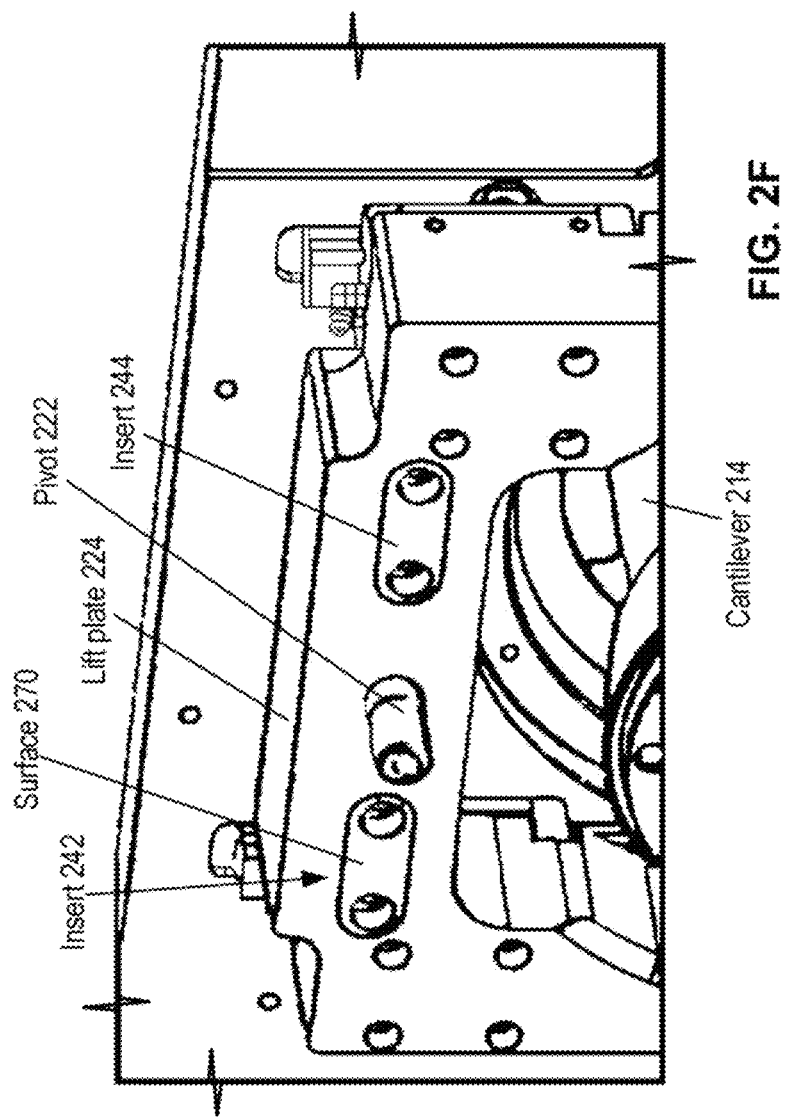

PLASMA PROCESSING SYSTEMS WITH MECHANISMS FOR CONTROLLING TEMPERATURES OF COMPONENTS

PRIORITY CLAIM

This application is related to and claims priority under 35 U.S.C. §119(e) to a commonly assigned provisional patent application entitled "Plasma Processing Systems With Mechanisms For Controlling Temperatures of Components," by James E. Tappan, Application Ser. No. 61/060,439 filed on Jun. 10, 2008, all of which are incorporated herein by reference.

BACKGROUND OF THE INVENTION

The present invention relates to controlling temperatures of components of plasma processing systems. As an example, the temperature control may relate to components involved in adjusting electrode-to-electrode parallelism in plasma processing systems.

In plasma processing, the shrinking feature sizes and the implementation of new materials in the next generation of device fabrication have put new requirements on plasma processing equipment. The smaller device features, larger substrate size, and new processing techniques (involving multi-step recipes, such as for dual-damascene etch) have increased the challenge to maintain good uniformity across the wafer for better device yields.

In capacitively coupled RF plasma reactors, the electrode opposite to the substrate electrode is generally called the upper electrode. The upper electrode could be grounded, or have one or more radio frequency (RF) power sources attached to it. The substrate electrode is generally called the lower electrode. A mechanical arrangement for a lower electrode in a capacitively coupled plasma processing chamber may involve cantilevering the assembly that includes the lower electrode from a side of the chamber. This cantilevered lower electrode can be a fixed distance from the upper electrode or can be designed for a variable distance from the upper electrode. In either case, parallelism of one electrode surface to the other is generally a critical mechanical parameter that can affect the process performance on the wafer.

Due to added complexity, many capacitively coupled RF plasma reactors may forgo the feature of precise parallelism adjustment between electrodes and may rely on tight manufacturing tolerances of the assembly components to keep parallelism within acceptable limits. This approach typically adds cost to those components and may limit the ultimate parallelism specification that can be achieved. For example, given that the assembly components may be subjected to temperature variations and that different components in the reactors may have different thermal properties, achieving the tight manufacturing tolerances of the assembly components may be challenging and costly.

Some arrangements may include slots or clearance holes in mating parts allowing free play to adjust parallelism during assembly. Such arrangements may be time consuming and may usually require repetitive processes to achieve the correct configuration. Such arrangements may also require the plasma processing system to be disassembled to some extent to adjust the necessary components. Further, the temperature under which the components are adjusted may be substantially different from the temperature which the components are subjected to during plasma processing. The effects of temperature variations may render the configuration incorrect or may require extra efforts in performing the adjustment.

Some arrangements may attempt to provide a means for adjustment, but may have no direct means to correlate the amount of adjustment to the actual effect on at least one of the electrodes. As a result, such methods may also require iterative processes to dial in parallelism. Some of these methods are also vulnerable to shifting of the adjustment over time due to vibrations (such as shipping loads) and/or temperature variations.

SUMMARY

An embodiment of the present invention relates to a plasma processing system with improved component temperature control. The system may include a plasma processing chamber having a chamber wall. The system may also include an electrode disposed inside the plasma processing chamber. The system may also include a support member disposed inside the plasma processing chamber for supporting the electrode. The system may also include a support plate disposed outside the chamber wall. The system may also include a cantilever disposed through the chamber wall for coupling the support member with the support plate. The system may also include a lift plate disposed between the chamber wall and the support plate. The system may also include thermally resistive coupling mechanisms for mechanically coupling the lift plate with the support plate.

The above summary relates to only one of the many embodiments of the invention disclosed herein and is not intended to limit the scope of the invention, which is set forth in the claims herein. These and other features of the present invention will be described in more detail below in the detailed description of the invention and in conjunction with the following figures.

BRIEF DESCRIPTION OF THE DRAWINGS

The present invention is illustrated by way of example, and not by way of limitation, in the figures of the accompanying drawings and in which like reference numerals refer to similar elements and in which:

FIG. 1A shows a partial perspective view of a plasma processing chamber including an adjustment mechanism for adjusting the orientation of a lower electrode in the plasma processing chamber in accordance with one or more embodiments of the present invention.

FIG. 1B shows a partial side view of the plasma processing chamber illustrating a first rotation (or the pitch) of the lower electrode in accordance with one or more embodiments of the present invention.

FIG. 1C shows a partial rear view of the plasma processing chamber illustrating a second rotation (or the roll) of the lower electrode in accordance with one or more embodiments of the present invention.

FIG. 1H shows a partial perspective view of a roll adjustment user interface of the adjustment mechanism in accordance with one or more embodiments of the present invention.

FIG. 1I, another view of FIG. 1A, shows a partial perspective view of the plasma processing chamber including an adjustment mechanism for adjusting the orientation of the lower electrode in the plasma processing chamber in accordance with one or more embodiments of the present invention.

FIG. 1J, another view of FIG. 1B, shows a partial side view of the plasma processing chamber illustrating the first rotation (or the pitch) of the lower electrode in accordance with one or more embodiments of the present invention.

FIG. 1K, another view of FIG. 1C, shows a partial rear view of the plasma processing chamber illustrating the second rotation (or the roll) of the lower electrode in accordance with one or more embodiments of the present invention.

FIG. 1O, another view of FIG. 1G, shows a perspective view of the roll adjustment cam of the adjustment mechanism in accordance with one or more embodiments of the present invention.

FIG. 2B shows a partial cutaway view of an electrode assembly of the plasma processing system including thermal insulation mechanisms in accordance with one or more embodiments of the present invention.

FIG. 2F shows a partial perspective view of a lift plate of the plasma processing system thermally resistive members/mechanisms implemented therein in accordance with one or more embodiments of the present invention.

DETAILED DESCRIPTION

Figure 1D:
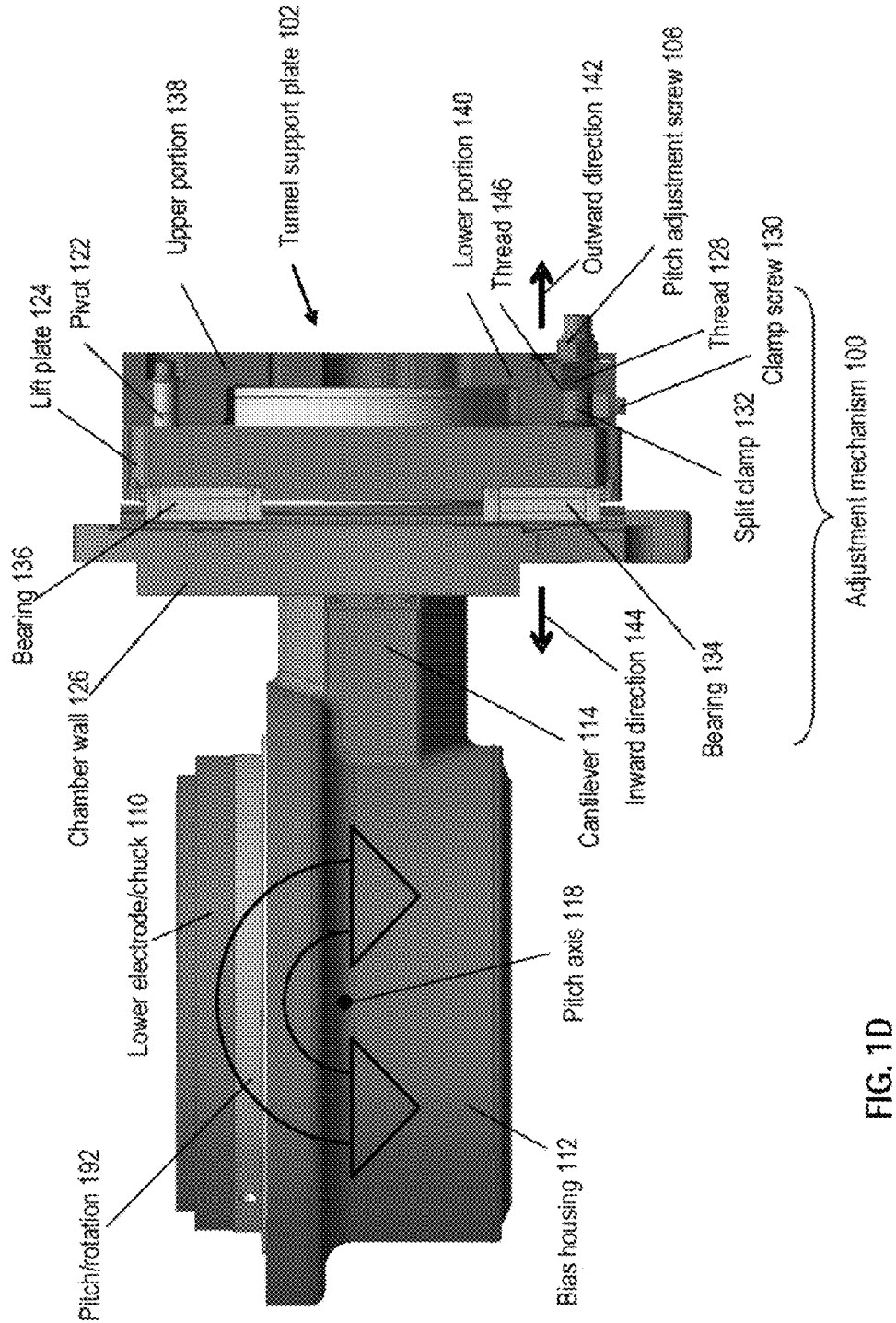
FIG. 1D shows a partial side view of the adjustment mechanism in accordance with one or more embodiments of the present invention.

The present invention will now be described in detail with reference to a few embodiments thereof as illustrated in the accompanying drawings. In the following description, numerous specific details are set forth in order to provide a thorough understanding of the present invention. It will be apparent, however, to one skilled in the art, that the present invention may be practiced without some or all of these specific details. In other instances, well known process steps and/or structures have not been described in detail in order to not unnecessarily obscure the present invention.

One or more embodiments of the invention relate to a plasma processing system with mechanisms for controlling temperatures of components of the plasma processing system. The plasma processing system may include a plasma processing chamber having a chamber wall. Inside the plasma processing chamber, the plasma processing system may include an electrode that may support a substrate during plasma processing; and a bias housing that may enclose a bias power source and may support the electrode. Outside the plasma processing chamber, the plasma processing system may include a support plate and a lift plate. The lift plate may be disposed between the chamber wall and the support plate. The plasma processing system may also include bearing mechanisms for coupling the lift plate with the chamber wall and for guiding the movement of the lift plate. The plasma processing system may also include a cantilever that may couple the bias housing with the support plate for supporting the weights of the bias housing, the electrode, the substrate, etc. The plasma processing system may also include temperature control mechanisms, such as thermal insulation members, one or more electrical fans, and thermally resistive members/mechanisms, discussed below, for controlling temperatures of components of the plasma processing system to optimize operation and extend life spans for the components.

The plasma processing system may include insulation members, such as one or more thermally insulative rings, disposed between the electrode and the bias housing. Accordingly, the effect of the temperature change (e.g., ranging from $-10°$ C. to $80°$ C.) of the electrode may be limited to the electrode without substantially propagating to other components of the plasma processing system. Advantageously, problems concerning unwanted thermal expansion and condensation may be minimized or prevented, and components (e.g., mechanical components and electrical components) of the plasma processing system may be protected.

The plasma processing system may also include a fan for blowing ambient temperature air (e.g., the air from the fabrication facility with temperature of about $20°$ C.) at the support plate, thereby minimizing temperature variations for the support plate and members thermally coupled with the support plate, such as the cantilever and the bias housing. Advantageously, the components of the plasma processing system may be further protected.

The plasma processing system may also include one or more thermally resistive members/mechanisms serving as interfaces between the lift plate and the support plate. Accordingly, even if the temperature change of the electrode during plasma processing causes a substantial temperature change of the support plate through the thermal coupling provided by the cantilever, the temperature of the lift plate may still remain substantially constant. As a result, there may not be substantial, unwanted expansion or contraction of the lift plate to exert unnecessary loads on components coupled with the lift plate, such as the bearing mechanisms. Advantageously, the components coupled with the lift plate may operate properly and may have long life spans.

The plasma processing system may not require complicated heating and cooling arrangements or devices, such as electrical resistance heaters or coolant channels. Accordingly, the manufacturing and maintenance costs for the plasma processing system may be minimized.

The plasma processing system may also include a mechanism for adjusting electrode-to-electrode parallelism. Since the temperature variations of components related to adjusting the electrode-to-electrode parallelism are minimized, the electrode-to-electrode parallelism may be accurately adjusted and may be maintained for a long period without frequent calibration. Advantageously, efforts and costs for optimizing plasma processing may be minimized.

One or more embodiments of the invention relate to a mechanism for adjusting electrode-to-electrode parallelism in a plasma processing system. The mechanism may separately adjust the orientation/rotation of the lower electrode in the pitch (front to back) and roll (side to side) directions. The mechanism may include low-cost, simple parts that collectively accomplish the high-precision adjustment for parallelism with a low combined cost.

The mechanism may allow electrode orientation/parallelism adjustment to take place while the system is under vacuum, at atmosphere, and/or in-situ, since the user interfaces of the mechanism are disposed outside the plasma processing chamber. The mechanism may also allow the adjustment to be made with minimum or no disassembly of the plasma processing system.

The mechanism may enable precise electrode orientation/parallelism adjustment. Precise adjustment of parallelism with accuracy up to 0.01 mm can easily be achieved. The mechanism may also include calibrated index marks to give clear feedback of the amount of adjustment, thereby eliminating the need for iterative adjusting and measuring.

The mechanism may also enable locking electrode orientation/parallelism settings. Once an adjusted electrode orientation/parallelism setting is securely locked down, the setting should stay unchanged through normal vibrations and shipping loads.

By utilizing low-cost parts and allowing fast adjustment-locking of parallelism to a precise level, the mechanism may reducing the need for tight manufacturing tolerances on major components and may cost-effectively optimize process performance with regard to electrode parallelism.

One or more embodiments of the invention relate to a plasma processing system that includes the electrode orientation/parallelism adjustment mechanism discussed above and further discussed in the examples below.

The features and advantages of the present invention may be better understood with reference to the figures and discussions that follow.

FIG. 1A shows a partial perspective view of a plasma processing chamber 198 including a mechanism 100 for adjusting the orientation of a lower electrode 110 (or chuck 110) in accordance with one or more embodiments of the present invention. For optimizing the processing yield in plasma processing chamber 198, the electrode-to-electrode parallelism between an upper electrode 198 and lower electrode 110 may be ensured by adjusting the orientation of lower electrode 110.

Mechanism 100 may include a tunnel support plate 102 (support plate 102) coupled with lower electrode 110 through a cantilever 114 and a bias housing 112. Mechanism 100 may also include a pitch adjustment screw 106 for adjusting the pitch of lower electrode 110; the pitch of lower electrode 110 is illustrated in the example of FIG. 1B. Mechanism 100 may also include a roll adjustment cam 104 for adjusting the roll of lower electrode 110; the roll of lower electrode 110 is illustrated in the example of FIG. 1C.

FIG. 1B shows a partial side view of plasma processing chamber 198 illustrating a first rotation 192 (pitch 192) in accordance with one or more embodiments of the present invention. Mechanism 100 may facilitate the adjustment of first rotation 192 (pitch 192) of lower electrode 110 with respect to a pitch axis 118. Pitch axis 118 is substantially orthogonal to a substrate insertion direction 116, in which a substrate may be inserted into plasma processing chamber 198.

FIG. 1C shows a partial rear view of plasma processing chamber 198 illustrating a second rotation 194 (roll 194) in accordance with one or more embodiments of the present invention. Mechanism 100 may facilitate the adjustment of second rotation 194 (roll 194) of lower electrode 110 with respect to a roll axis 120. Roll axis 120 is substantially parallel to substrate insertion direction 116

FIG. 1D shows a partial side view of mechanism 100 in accordance with one or more embodiments of the present invention. In mechanism 100, support plate 102 may be disposed outside a chamber wall 126 of plasma processing chamber 198 (shown in the example of FIG. 1A). Support plate 102 may be pivoted relative to chamber wall 126, for example, by pivot 122 and/or another pivot mechanism at a portion 138, e.g., the upper portion, of support plate 102. The support plate may have a thread 146 that may engage a thread 128 of pitch adjustment screw 106. Accordingly, turning pitch adjustment screw 106 may cause the translation of a portion 140 (e.g., the lower portion) of support plate 102 relative to pitch adjustment screw 106 in an outward direction 142 or an inward direction 144. The translation of portion 140 of support plate 102 may cause rotation of support plate 102 with respect to chamber wall 126. Since support plate 102 is coupled with lower electrode 110, the rotation of support plate 102 following direction 142 or 144 may substantially cause rotation of lower electrode 110 with respect to pitch axis 118. The precision of threads 146 and 128 may enable the amount of rotation 192 of lower electrode 110 to be stably and precisely adjusted.

Mechanism 100 may also include a lift plate 124 disposed between chamber wall 126 and support plate 102. Mechanism 100 may also include one or more bearings, such as bearings 134 and 136, coupled with lift plate 124 and chamber wall 126. The one or more bearings may facilitate and/or guide the movement of support plate 102 relative to chamber wall 126 (e.g., translation in direction 142 or 144, and/or translation in a direction perpendicular to direction 142 or 144), for smooth and precise adjustment of rotation 192 of lower electrode 110.

Mechanism 100 may also include a clamping mechanism, for example, including a split clamp 132 and a clamp screw 130, for locking/fastening pitch adjustment screw 106 to support plate 102, thereby preventing pitch adjustment screw 106 from rotation and translation. For example, it may be desirable to have pitch adjustment screw 106 clamped after the pitch adjustment for lower electrode 110 has been completed for locking down the setting. Split clamp 132 may surround pitch adjustment screw 106. Clamp screw 130 may be disposed substantially perpendicular to pitch adjustment screw 106 and may be coupled with split clamp 132 for pressing split clamp 132 to secure pitch adjustment screw 106. A tool slot may be implemented on clamp screw 130 for facilitating the user to rigidly lock/clamp the entire mechanism 100 once the pitch adjustment has been completed.

Figure 1E:
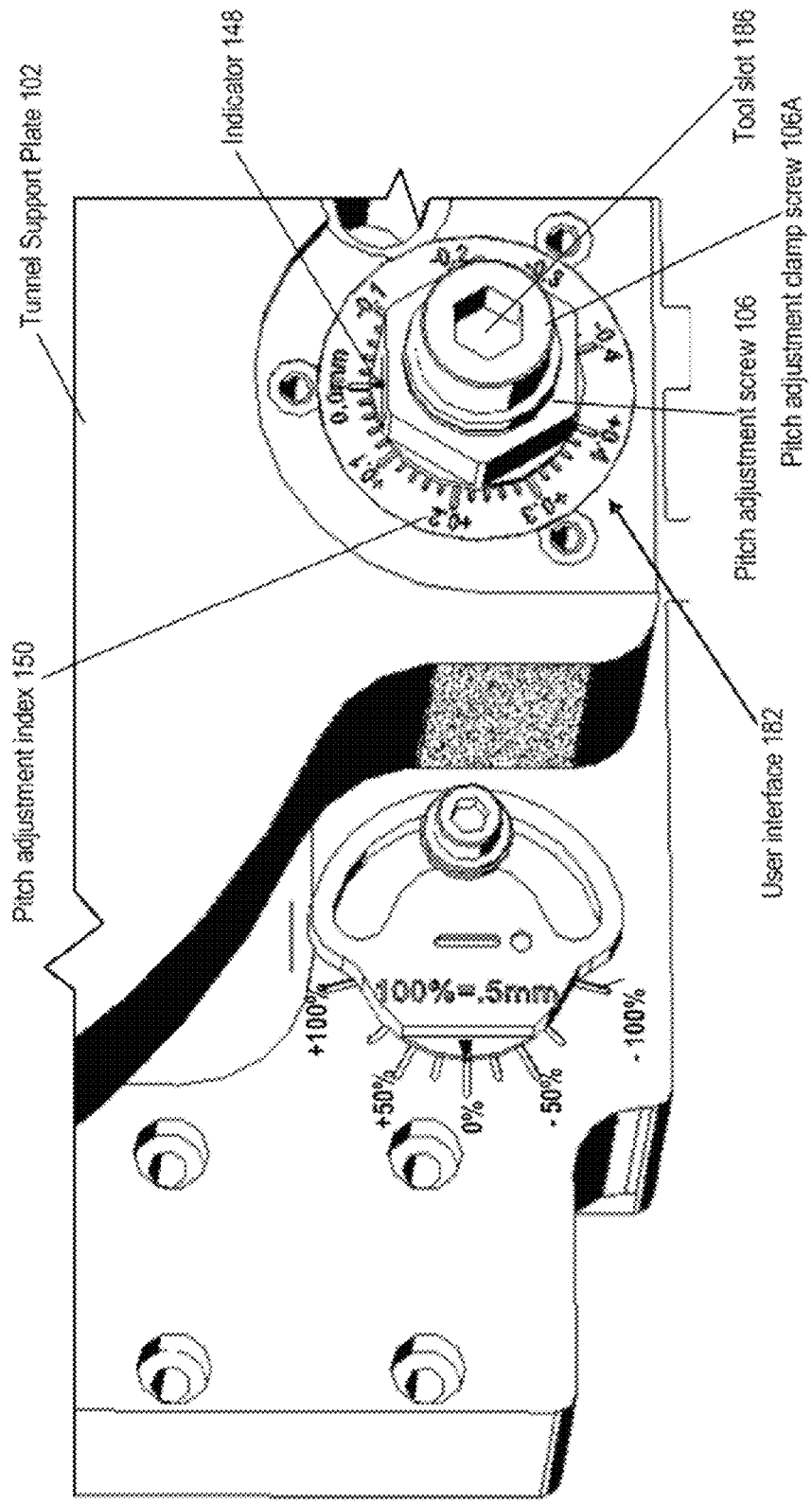
FIG. 1E shows a partial perspective view of a pitch adjustment user interface of the adjustment mechanism in accordance with one or more embodiments of the present invention.

FIG. 1E shows a partial perspective view of a user interface 182 of mechanism 100 for adjusting pitch 192 of lower electrode 110 in accordance with one or more embodiments of the present invention. User interface 182 may include at least one pitch adjustment index 150 implemented on support plate 102 for providing visual feedback concerning pitch adjustment to a user. User interface 182 may also include an indicator 148 implemented on pitch adjustment screw 106 for cooperating with pitch adjustment index 150 to indicate the amount of pitch adjustment. Alternatively or additionally, a pitch adjustment index may be implemented on pitch adjustment screw 106, and/or an indicator may be implemented on support plate 102.

Mechanism 100 may also include a pitch adjustment clamp screw 106A coupled with and at least partially inserted into pitch adjustment screw 106. Pitch adjustment clamp screw 106A may secure pitch adjustment screw 106 to support plate 102. A tool slot 186 may be implemented on a pitch adjustment clamp screw 106A for facilitating the user to rigidly lock/clamp pitch adjustment screw 106 and/or the entire mechanism 100 once the pitch adjustment has been completed.

In one or more embodiment, pitch adjustment screw 106 may be coupled with an automatic control mechanism for controlling the pitch adjustment and/or calibration in an automatic fashion. The automatic control mechanism may include, for example, a sensor, a control logic unit, and a motor (e.g., a high-resolution step motor).

Figure 1F:
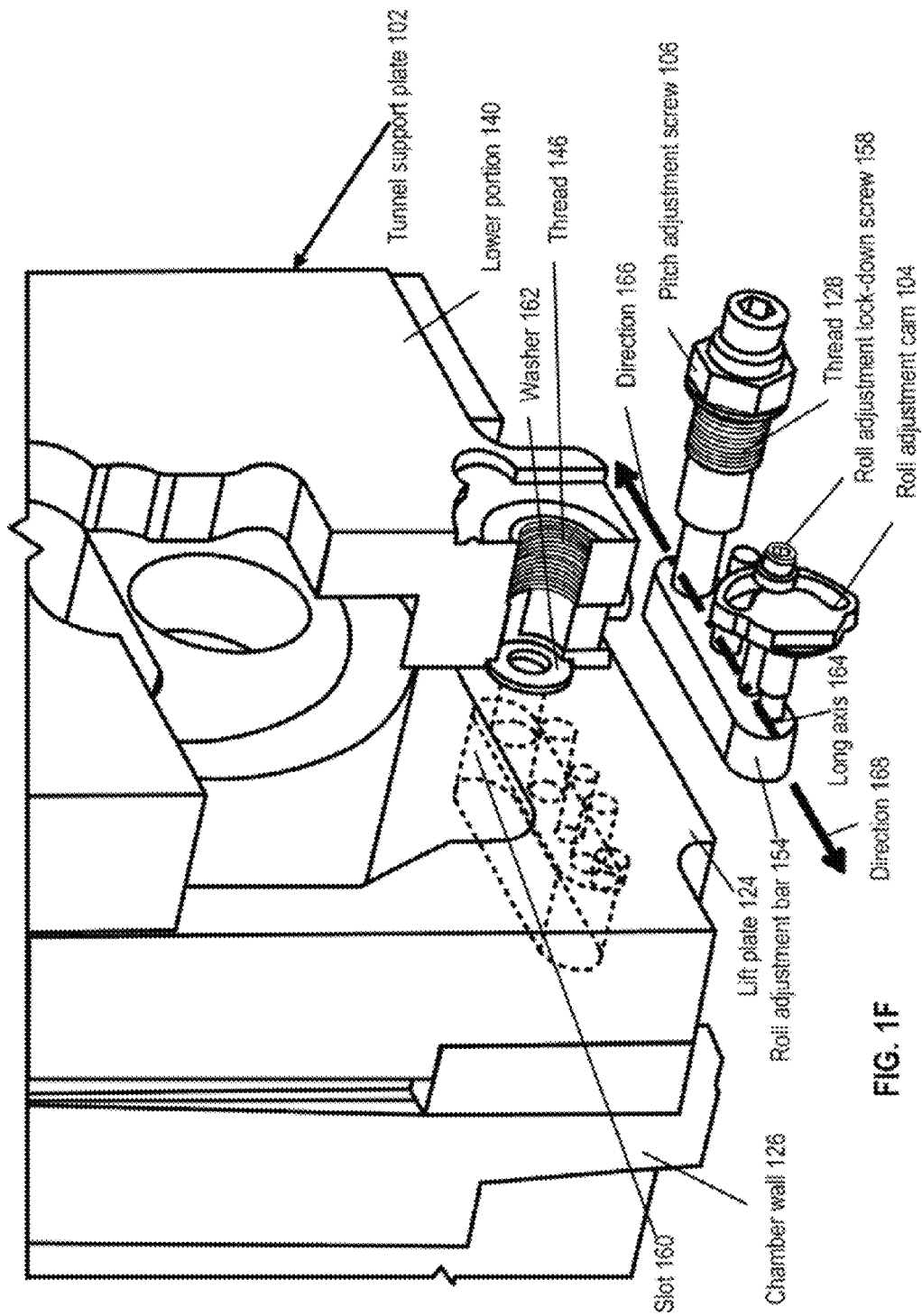
FIG. 1F shows a partial exploded view of the adjustment mechanism in accordance with one or more embodiments of the present invention.

FIG. 1F shows a partial exploded view of mechanism 100 in accordance with one or more embodiments of the present invention. Mechanism 100 may include a roll adjustment bar 154 coupled with roll adjustment cam 104 and may be actuated by roll adjustment cam 104. Roll adjustment bar 154 may be coupled with support plate 102 by pitch adjustment screw 106. Accordingly, through roll adjustment bar 154, roll adjustment cam 104 may actuate translation of portion 140 of support plate 102. As a result, support plate 102 may rotate relative to chamber wall 126 with respect to pivot 122 (shown in the example of FIG. 1D), thereby causing rotation 194 (roll 194) of lower electrode 110 shown in the example of FIG. 1C.

Constrained and guided by slot 160 in lift plate 124, roll adjustment bar 154 may translate along a long axis 164 of roll adjustment bar 154 in direction 166 or 168. Accordingly, the amount of rotation 194 of lower electrode 110 may be stably and precisely adjusted.

Mechanism 100 may also include a roll adjustment lock-down screw 158 coupled with roll adjustment cam 104. Roll adjustment lock-down screw 158 may lock roll adjustment cam 104 relative to roll adjustment bar 154 and may simultaneously lock roll adjustment bar 154 relative to lift plate 124, thereby preventing (further) rotation 194 (roll 194) of lower electrode 110. Roll adjustment lock-down screw 158 may be utilized, for example, after roll adjustment for lower electrode 110 has been completed.

Mechanism 100 may also include a washer 162 (e.g., a precision, hardened washer) coupled with lift plate 124 for receiving pitch adjustment screw 106. Washer 162 may protect lift plate 124 from being damaged by pitch adjustment screw 106. Washer 162 may also provide low friction to facilitate smooth movement of pitch adjustment screw 106, thereby further smoothing and stabilizing the operation of mechanism 100.

Figure 1G:
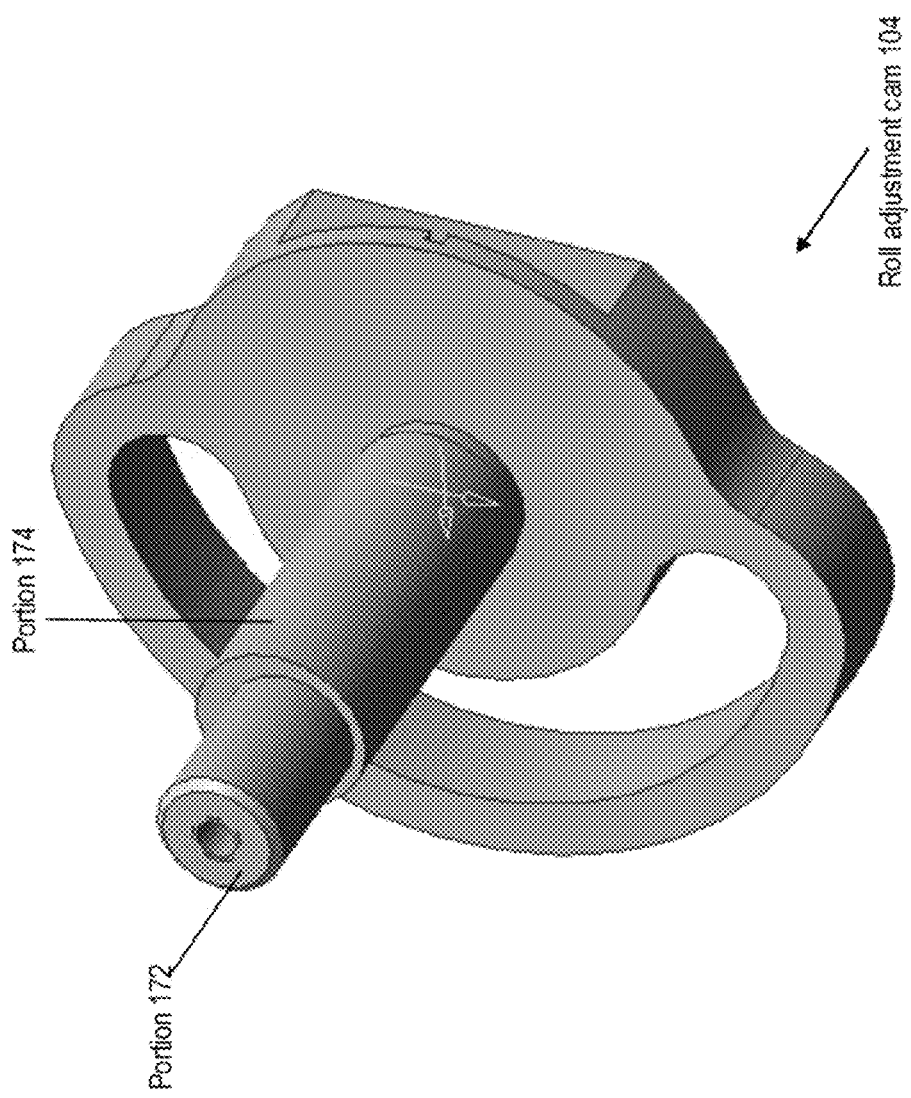
FIG. 1G shows a perspective view of a roll adjustment cam of the adjustment mechanism in accordance with one or more embodiments of the present invention.
Figure 1L:
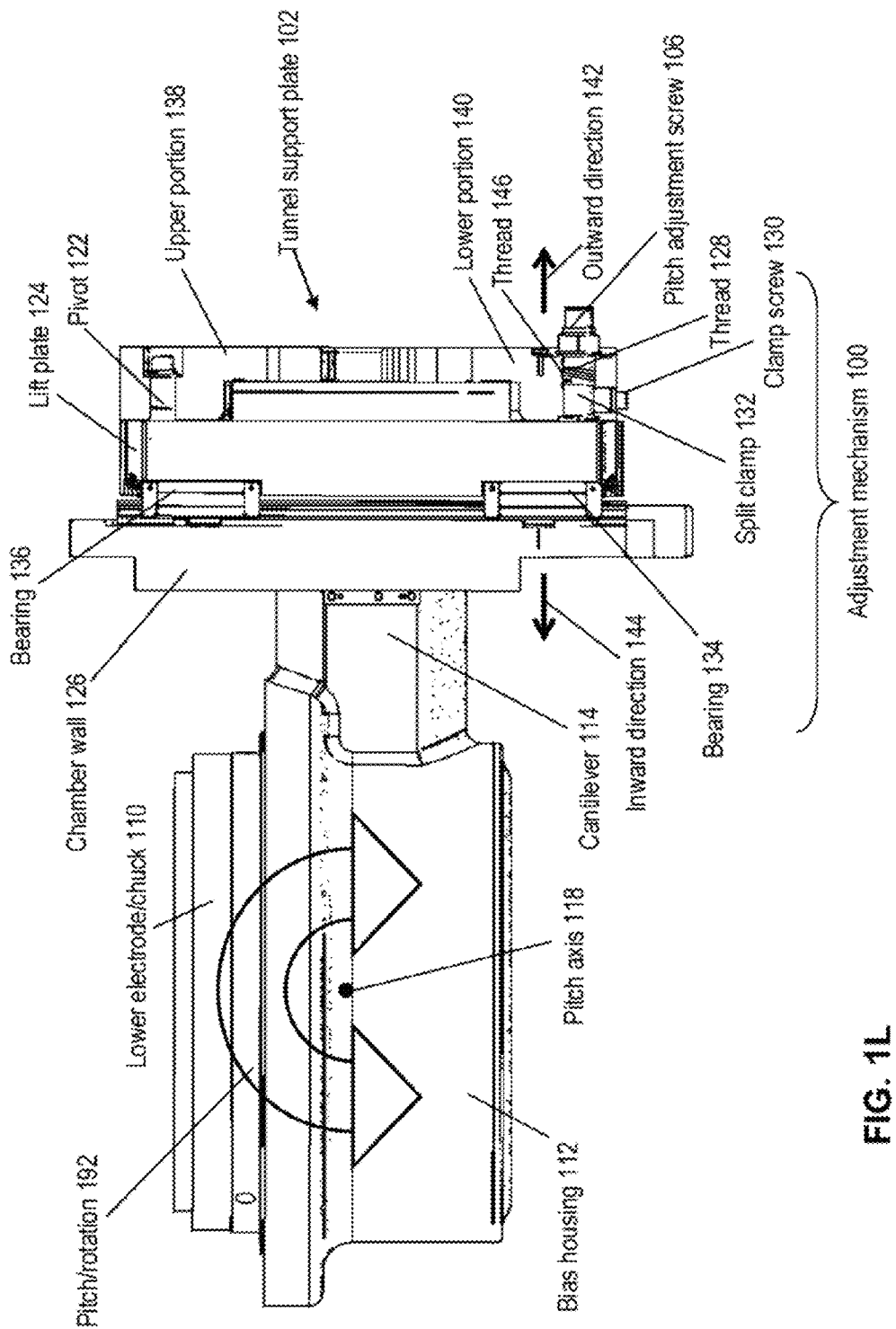
FIG. 1L, another view of FIG. 1D, shows a partial side view of the adjustment mechanism in accordance with one or more embodiments of the present invention.

FIG. 1G shows a perspective view of roll adjustment cam 104 in accordance with one or more embodiments of the present invention. Roll adjustment cam 104 may include a portion 172 disposed in an eccentric/offset arrangement with respect to a portion 174 of roll adjustment cam 104, for enabling roll adjustment cam 104 to actuate roll adjustment bar 154 (shown in the example of FIG. 1F). Roll adjustment cam 104 may be replaced with other replacement roll adjustment cams with different eccentric/offset arrangements for particular actuation effects that suit particular roll adjustment needs.

FIG. 1H shows a partial perspective view of a user interface 184 mechanism 100 for adjusting roll 194 of lower electrode 110 in accordance with one or more embodiments of the present invention. User interface 184 may include at least one roll adjustment index 178 implemented on lift plate 124 for providing visual feedback concerning roll adjustment to a user. User interface 184 may also include an indicator 180 implemented on roll adjustment cam 104 for cooperating with roll adjustment index 178 to indicate the amount of roll adjustment. Alternatively or additionally, a roll adjustment index may be implemented on roll adjustment cam 104, and/or an indicator may be implemented on lift plate 124. A tool slot 176 may be implemented on roll adjustment cam 104 for facilitating the user to perform the roll adjustment, for example, utilizing a screw driver.

In one or more embodiment, roll adjustment cam 104 and/or pitch adjustment screw 106 may be coupled with an automatic control mechanism for controlling pitch and/or roll adjustment and/or calibration in an automatic fashion. The automatic control mechanism may include, for example, a sensor, a control logic unit, and a motor (e.g., a high-resolution step motor).

Figure 2A:
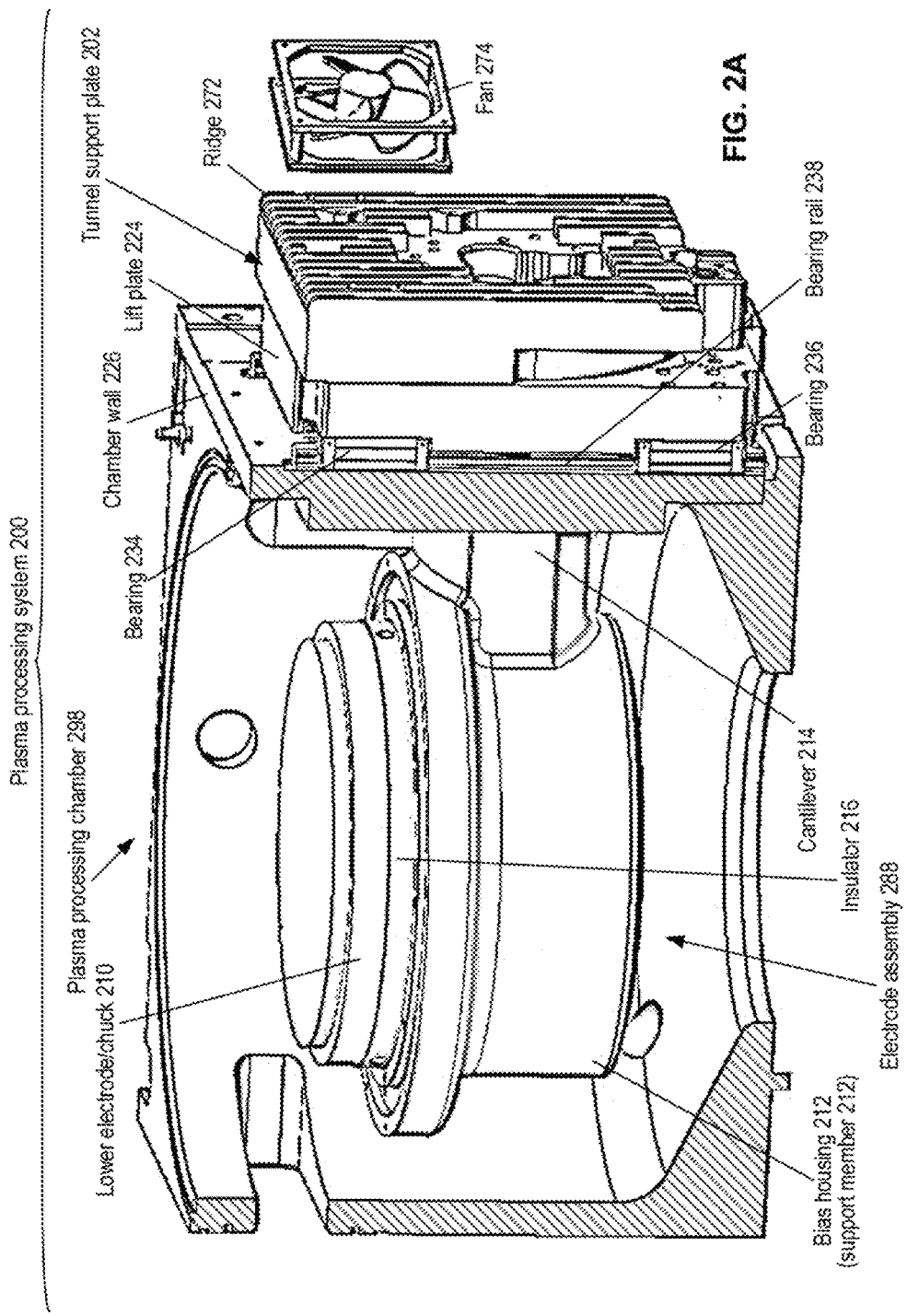
FIG. 2A shows a partial cutaway view of a plasma processing system including mechanisms for controlling temperatures of components of the plasma processing system in accordance with one or more embodiments of the present invention.

FIG. 2A shows a partial cutaway view of a plasma processing system 200 including mechanisms for controlling temperatures of components of plasma processing system 200 in accordance with one or more embodiments of the present invention. Plasma processing system 200 may include a plasma processing chamber 298, having a chamber wall 226, for enclosing the substrate to be processed and for containing the plasma generated for processing the substrate.

Inside plasma processing chamber 298, plasma processing system 200 may include an electrode assembly 288. Electrode assembly 288 may include an electrode 210 (or chuck 210) that may support the substrate during plasma processing. Electrode assembly 288 may also include a bias housing 212 (or support member 212) that may enclose a bias power source and may support electrode 210. Electrode assembly 288 may also include one or more thermal insulation members, such as insulator 216, disposed between electrode 210 and bias housing 212. Accordingly, the effect of temperature change (e.g., ranging from −10° C. to 80° C.) of electrode 210 may be limited to electrode 210 without substantially propagating to other components of plasma processing system 200 through bias housing 212. Advantageously, problems concerning unwanted thermal expansion and condensation may be minimized or prevented, and components (e.g., mechanical components and electrical components) of plasma processing system 200 may be protected from damage and/or malfunction. Electrode assembly 288 and the thermal insulation members are further discussed with reference to the example of FIG. 2B.

Outside plasma processing chamber 298, plasma processing system 200 may include a tunnel support plate 202 (or support plate 202). Plasma processing system 200 may also include a lift plate 224 disposed between chamber wall 226 and support plate 202. Plasma processing system 200 may also include one or more bearing mechanisms (such as bearing mechanism 234, bearing mechanism 236, and bearing rail 238) for coupling lift plate 224 with chamber wall 226 and for precisely guiding the movement of lift plate 224 (thereby precisely guiding the motion of the cantilevered electrode 210). In one or more embodiments, given material characteristics and small contact areas, the one or more bearing mechanisms may introduce thermal isolation between lift plate 224 and chamber wall 226. For example, a bearing mechanism may include stainless steel ball bearings that provide low thermal conduction and small contact points.

Plasma processing system 200 may also include a cantilever 214 that may couple bias housing 212 with support plate 202 for supporting the weights of electrode assembly 288, the substrate, etc. Cantilever 214 may also be utilized for controlling the motion of electrode assembly 288 to adjust the electrode-to-electrode parallelism for plasma processing system 200.

Plasma processing system 200 may also include one or more thermally resistive members/mechanisms serving as interfaces between lift plate 224 and support plate 202 for providing thermal isolation between lift plate 224 and support plate 202. The one or more thermally resistive members/mechanisms may include members made of low-thermal-conductivity material, such as stainless steel, and/or thermally insulative material, such as ceramic material. Accordingly, even if the temperature change of electrode 210 during plasma processing causes a substantial temperature change of support plate 202 through the thermal coupling provided by cantilever 214, the temperature of lift plate 224 may still remain substantially constant. As a result, there may not be substantial unwanted expansion or contraction of lift plate 224 to exert unnecessary loads on components coupled with lift plate 224, such as the bearing mechanisms. Advantageously, the components coupled with lift plate 224 may operate properly and may have long life spans. The thermally resistive members/mechanisms are further discussed with reference to the examples of FIGS. 2C-2F.

Plasma processing system 200 may also include one or more fans, such as a electrical fan 274, for blowing ambient temperature air (e.g., the air from the fabrication facility with temperature of about 20° C.) at support plate 202 (disposed between chamber wall 226 and electrical fan 274), thereby minimizing temperature variations for support plate 202 and members thermally coupled with support plate 202, such as cantilever 214 and bias housing 212. Advantageously, the components of plasma processing system 200 may be further protected against unwanted thermal expansion and condensation. Plasma processing system 200 may include an enclosure enclosing plasma processing chamber 298, lift plate 224, tunnel support plate 202, etc., wherein electrical fan 274 may introduce the ambient temperature air into the enclosure. Support plate 202 may include ridges (such as ridge 272, disposed facing electrical fan 274) to maximize the surface area of support plate 202 that is exposed to the ambient temperature air for effectively minimizing temperature variations of support plate 202 as well as components thermally coupled with support plate 202.

With the thermal insulation members and/or the thermally resistive members for introducing thermal isolation and with the one or more fans for introducing ambient temperature air, plasma processing system 200 may not require complicated, expensive heating and cooling arrangements or devices, such as electrical resistance heaters or coolant channels. Accordingly, the manufacturing and maintenance costs for plasma processing system 200 may be minimized.

FIG. 2B shows a partial cutaway view of electrode assembly 288 of plasma processing system 200 (shown in the example of FIG. 2A) including thermal insulation mechanisms in accordance with one or more embodiments of the present invention. For example, the thermal insulation mechanisms may include insulator 216 (e.g., an insulative ring) disposed between bias housing 212 and electrode 210; a first o-ring disposed between insulator 216 and electrode 210 (e.g., installed at o-ring groove 252 of electrode 210); and a second o-ring disposed between insulator 216 and bias housing 212 (e.g., installed at o-ring groove 254 of bias housing 212). Insulator 216 and the o-rings may be made of thermally insulative material. For example, insulator may be made of ceramic material, such as alumina; the o-rings may be made of flouro silicon material. Accordingly, the temperature change of electrode 210 may be isolated without substantially propagating through bias housing 212.

The outer diameter of the first o-ring (installed at o-ring groove 252) may be minimized to maximize a vacuum interface 266 between insulator 216 and electrode 210. The inner diameter of the first o-ring also may be minimized to minimize an atmospheric interface 262 between insulator 216 and electrode 210. Accordingly, the thermal isolation between insulator 216 and electrode 210 (and therefore the thermal isolation between bias housing 212 and electrode 210) may be reinforced.

Similarly, the outer diameter of the second o-ring (installed at o-ring groove 254) may be minimized to maximize a vacuum interface 268 between insulator 216 and bias housing 212; the inner diameter of the second o-ring also may be minimized to minimize an atmospheric interface 264 between insulator 216 and bias housing 212. Accordingly, the thermal isolation between insulator 216 and bias housing 212 (and therefore the thermal isolation between bias housing 212 and electrode 210) may be reinforced.

Figure 2C:
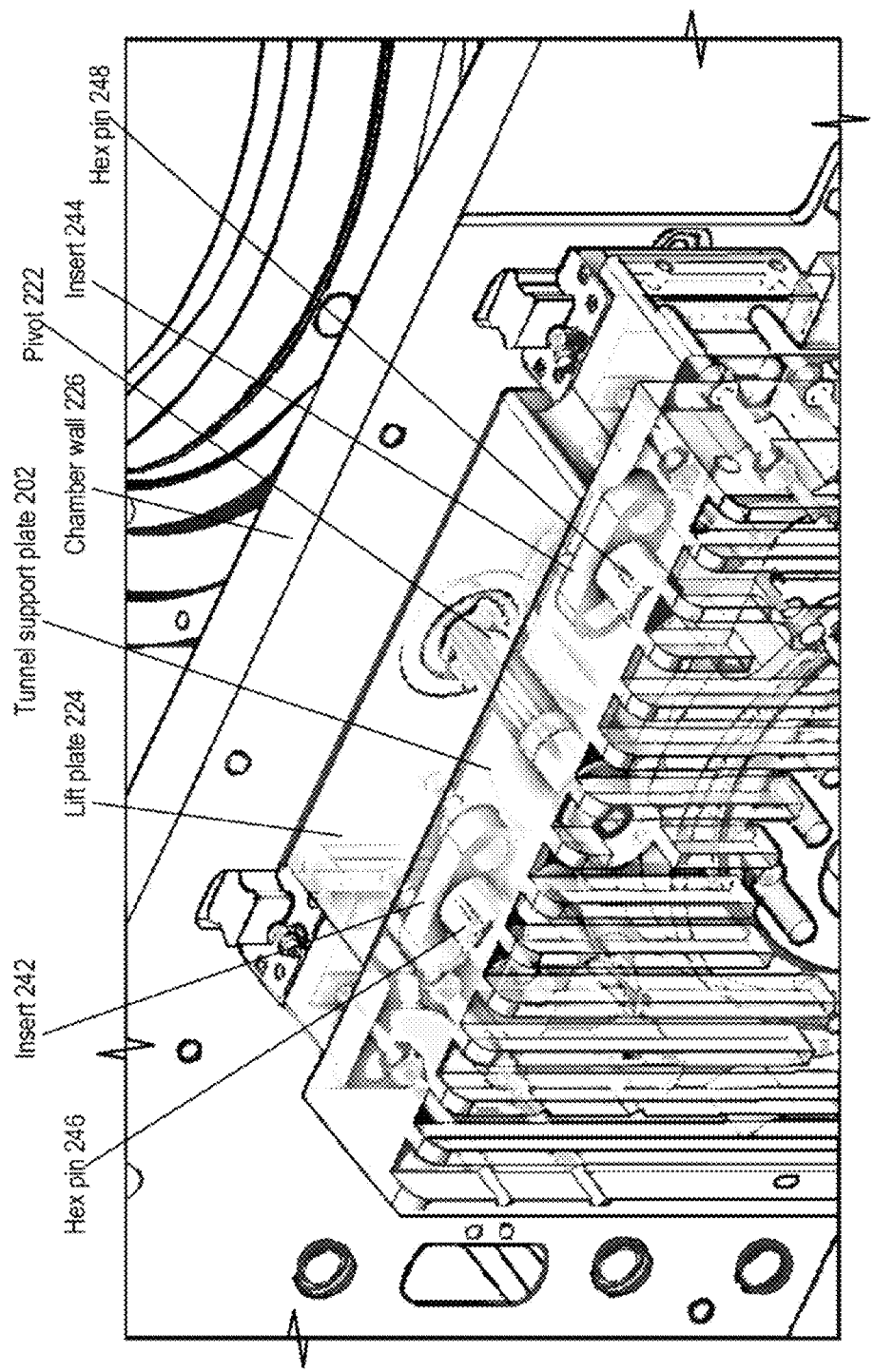
FIG. 2C shows a partial perspective view of the plasma processing system including thermally resistive members/mechanisms in accordance with one or more embodiments of the present invention.

FIG. 2C shows a partial perspective view of plasma processing system 200 including thermally resistive members/mechanisms in accordance with one or more embodiments of the present invention. In the example of FIG. 2C, lift plate 224 and support plate 202 are shown as translucent for showing the thermal resistive members/mechanisms, through lift plate 224 and support plate 202 may not be translucent in one or more embodiments of the invention. The thermally resistive members/mechanisms may provide thermal isolation between lift plate 224 and support plate 202. Accordingly, even if the temperature change of electrode 210 during plasma processing causes a substantial temperature change of support plate 202 through the thermal coupling provided by cantilever 214, the temperature of lift plate 224 may still remain substantially constant. As a result, there may not be substantial, unwanted expansion or contraction of lift plate 224 to exert unnecessary loads on components coupled with lift plate 224, such as the bearing mechanisms. Advantageously, the components coupled with lift plate 224 may operate properly and may have long life spans.

The thermally members/mechanisms may include a thermally resistive pivot mechanism 222 (or pivot 222). Pivot 222 may mechanically couple support plate 202, lift plate 224, and chamber wall 226. Pivot 222 may facilitate support plate 202 to rotate with respect to lift plate 224 and chamber wall 226. Since pivot 222 is made of thermally resistive material, such as stainless steel, pivot 222 may provide thermal isolation between support plate 202 and lift plate 224.

The thermally members/mechanisms may also include one or more thermally resistive polygon pins, such as a stainless steel hex pin 246 and a stainless steel hex pin 248, disposed at support plate 202 to serve as one or more interfaces between support plate 202 and lift plate 224. The thermally members/mechanisms may also include one or more thermally resistive members, such as a stainless steel insert 242 and a stainless steel insert 244, disposed at lift plate 244 to serve as one or more interfaces between support plate 202 and lift plate 224. For example, a first end of hex pin 246 may be inserted into a round hole of support plate 202, and a second end of hex pin 246 may protrude or be exposed from support plate 202 to contact an exposed surface of insert 242 (which may be bolted into lift plate 224). Accordingly, the thermally resistive hex pin 246 and insert 242 may prevent direct contact between support plate 202 and lift plate 224, thereby providing thermal isolation between support plate 202 and lift plate 224. Hex pin 246 and insert 242 may have smooth surfaces and may also smooth the relative movement between support plate 202 and lift plate. In one or more embodiments, the one or more polygon pins may include one or more pins with other configurations, such as square pins.

In one or more embodiments, the thermally members/mechanisms may include one or more thermally resistive polygon pins disposed at lift plate 224 and one or more thermally resistive members disposed at support plate 202 to serve as one or more interfaces and to provide thermal isolation between support plate 202 and lift plate 224. In one or more embodiments, the one or more polygon pins may include one or more square pins and/or hex pins.

Figure 2D:
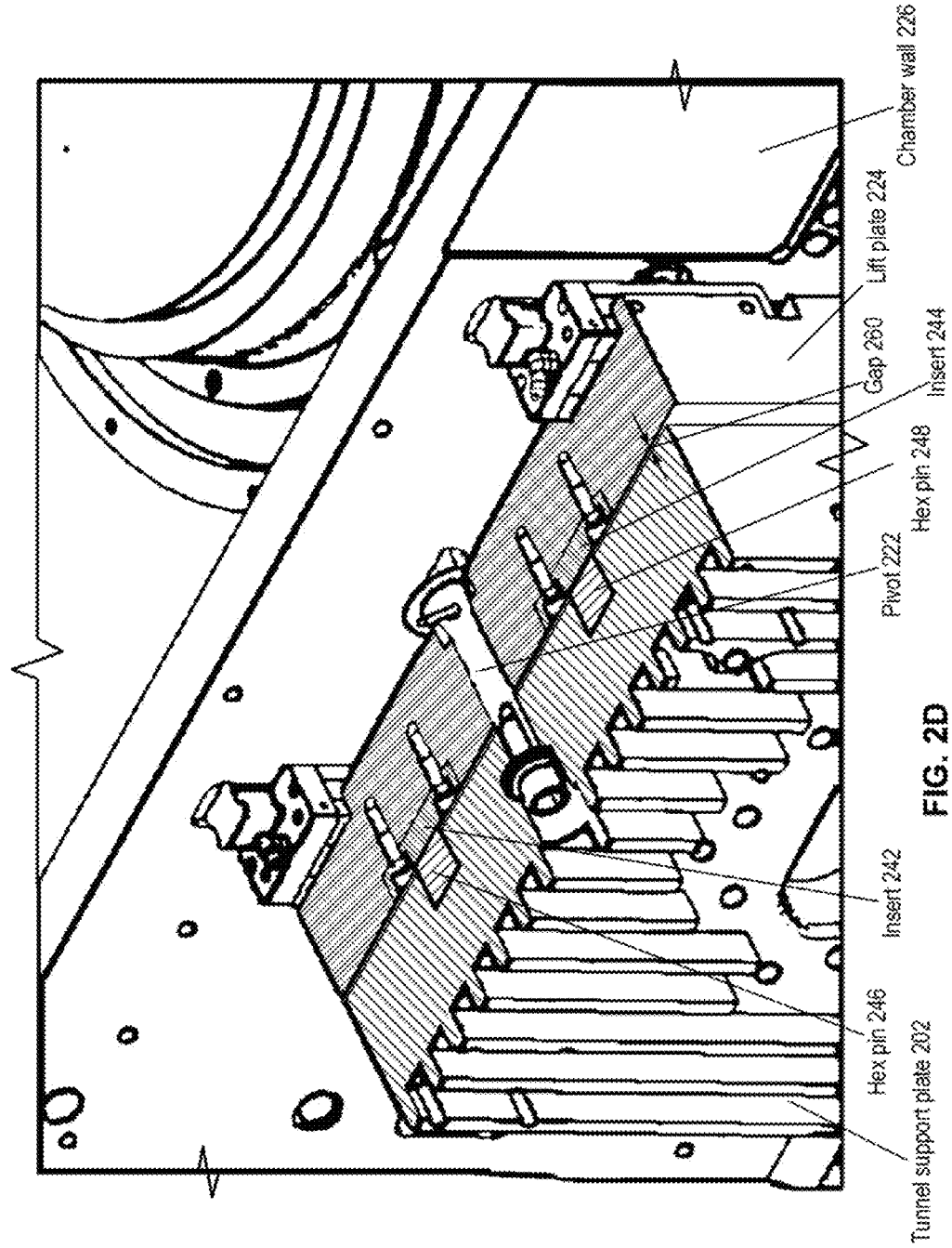
FIG. 2D shows a partial cutaway view of the plasma processing system including the thermally resistive members/mechanisms in accordance with one or more embodiments of the present invention.

FIG. 2D shows a partial cutaway view of plasma processing system 200 including the thermally resistive members/mechanisms in accordance with one or more embodiments of the present invention. As also shown in the example of FIG. 2C, the thermally resistive members/mechanisms may include pivot 222, hex pin 246, insert 242 for contacting hex pin 246, hex pin 248, and insert 244 for contacting hex pin 248. One or more of hex pin 246, insert 242, hex pin 248, and insert 244 may determine the width of a gap 260 between support plate 202 and lift plate 224. For example, the width of gap 260 may be determined by a protrusion of hex pin 248 protruding from support plate 202 and/or a protrusion of insert 244 protruding from lift plate 224. The width of gap 260 may be configured for the optimal thermal insulation between support plate 202 and lift plate 224 and for the optimal operation of support plate 202, etc.

Figure 2E:
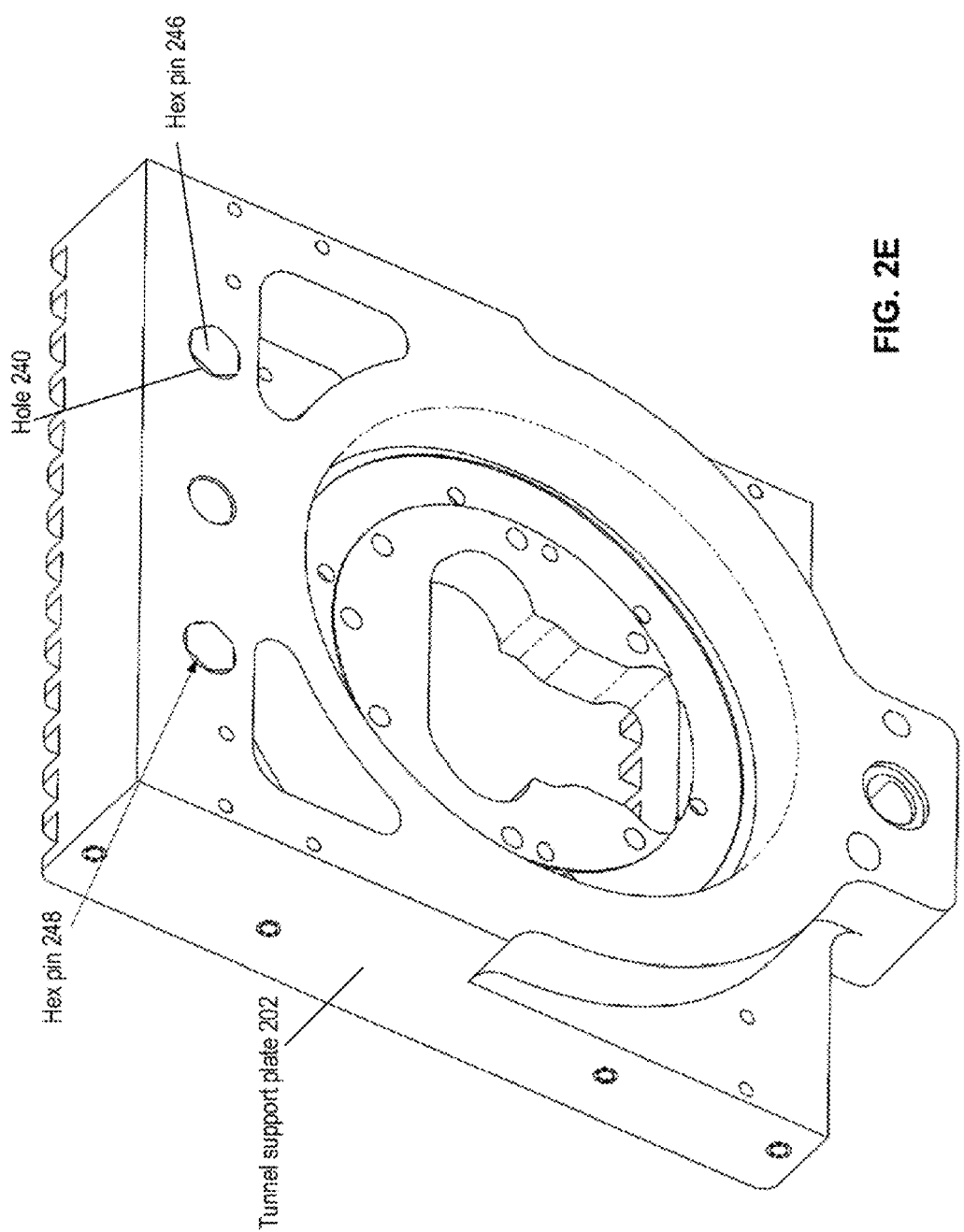
FIG. 2E shows a perspective view of a support plate of the plasma processing system with thermally resistive members/mechanisms implemented therein in accordance with one or more embodiments of the present invention.

FIG. 2E shows a perspective view of support plate 202 with thermally resistive members/mechanisms, such as hex pin 246 and hex pin 248, implemented therein in accordance with one or more embodiments of the present invention. The hex pins may reinforce thermal isolation between support plate 202 and lift plate 224 (shown in the examples of FIGS. 2C and 2D). As an example, hex pin 246 may be made of stainless steel and may have low thermal conductivity. An end of hex pin 246 may be pressed into a round hole 240, and the other end of hex pin 246 may be exposed to contact insert 242 (shown in the examples of FIGS. 2C and 2D). Hex pin 246 and hole 240 may only contact at the edges along the length of hex pin 246; therefore, very little thermal conduction may occur between hex pin 246 and support plate 202, and any thermal exchange between support plate 202 and lift plate 224 may need to be to conducted along the length of the pin, a much longer path. Further, hex pin 246 may contact stainless insert 242 bolted into lift plate 224 rather than directly contacting any thermally conductive portion (e.g., an aluminum portion) of lift plate 224. As a result, thermal isolation between support plate 202 and lift plate 224 may be reinforced.

FIG. 2F shows a partial perspective view of lift plate 224 with thermally resistive members/mechanisms, such as pivot 222, insert 242, and insert 244, implemented therein in accordance with one or more embodiments of the present invention. Lift plate 224 may have no direct contact with cantilever 214, which is thermally coupled with support plate 202 (shown in the example of FIGS. 2C-2E). The thermally resistive members/mechanisms may further prevent lift plate 224 from directly contacting support plate 202 for providing thermal isolation between lift plate 224 and support plate 202. For example, insert 242 may have a surface 270 exposed from lift plate 224 and/or a protrusion protruding from lift plate 224 to contact an end of thermally resistive hex pin 246 (shown in the example of FIGS. 2C-2E), thereby preventing direct contact between lift plate 224 and support plate 202.

Figure 3:
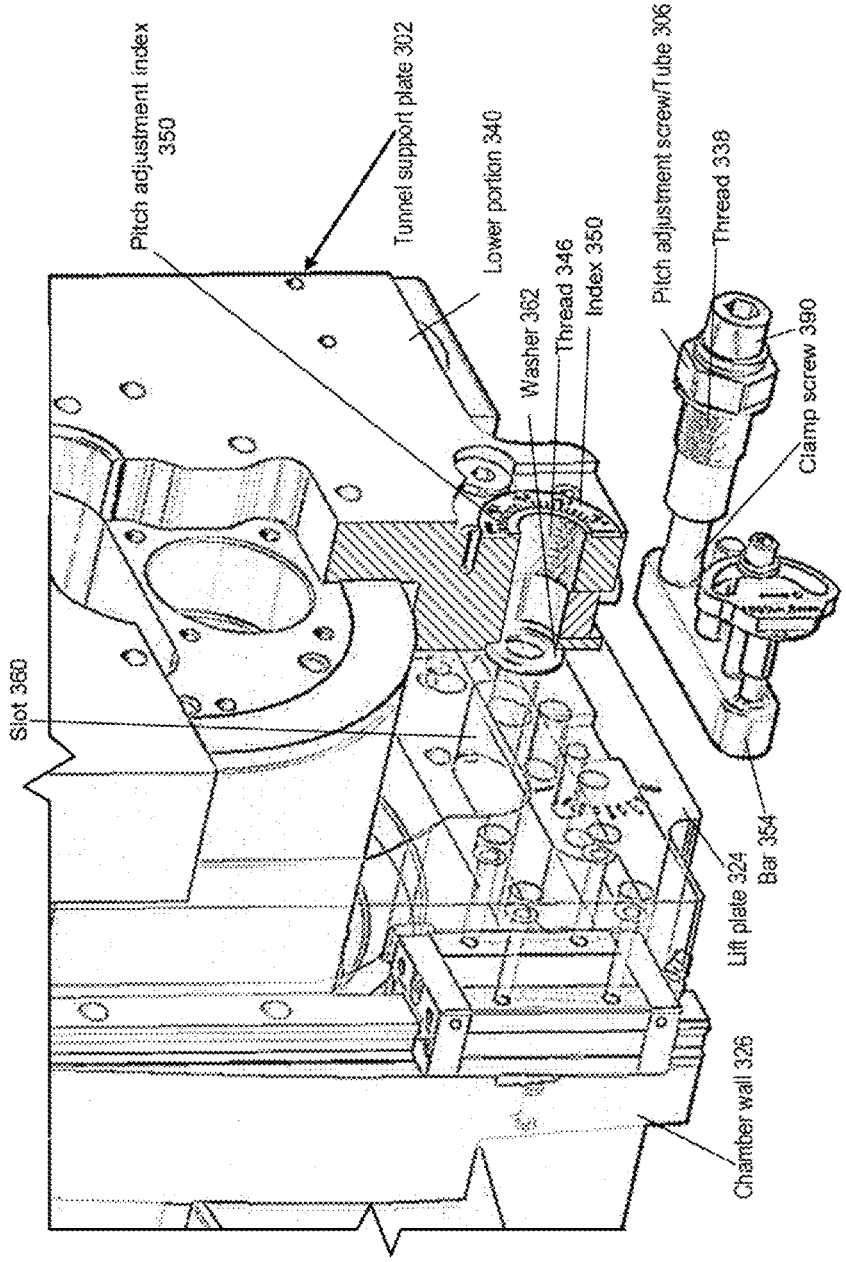
FIG. 3 shows a partial cutaway view of a plasma processing system including thermally resistive members/mechanisms for controlling temperatures of components in accordance with one or more embodiments of the present invention.

FIG. 3 shows a partial cutaway view of a plasma processing system 300 including thermally resistive members/mechanisms for controlling temperatures of components in accordance with one or more embodiments of the present invention. In the example of FIG. 3, a lift plate 324 is shown as partially transparent/translucent for better illustrating embodiments of the invention, though lift plate 324 may not be transparent/translucent in the embodiments. The thermally resistive members/mechanisms may mechanically couple lift plate 324 with a support plate 302. The thermally resistive members/mechanisms may also provide thermal isolation between lift plate 324 and support plate 302. Accordingly, even if there is substantial temperature change of support plate 302, the temperature of lift plate 324 may still remain substantially constant. As a result, there may not be substantial, unwanted expansion or contraction of lift plate 324 to exert unnecessary loads on components coupled with lift plate 324. Advantageously, the components may operate properly and may have long life spans.

The thermally resistive members/mechanisms may include, for example, a thermally resistive bar 354 (or bar 354), a thermally resistive tube 306 (or tube 306), a thermally resistive screw 390 (or screw 390), a thermally resistive washer 362 (or washer 362). Bar 354 may be disposed in a slot 360 on the back side of lift plate 324. Tube 306 may be coupled with support plate 302. Screw 390 may pass through tube 306 to thread into bar 354 for mechanically coupling/clamping lift plate 324 with support plate 302. Washer 362 may be coupled with lift plate 324 to receive screw 390. Washer 362 may contact an end of tube 306. Washer 362 and/or tube 306 may be configured to determine the width of a gap between lift plate 324 and support plate 302 for optimizing the operation of support plate 302 while reinforcing the thermal insulation between lift plate 324 and support plate 302.

Figure 1M:
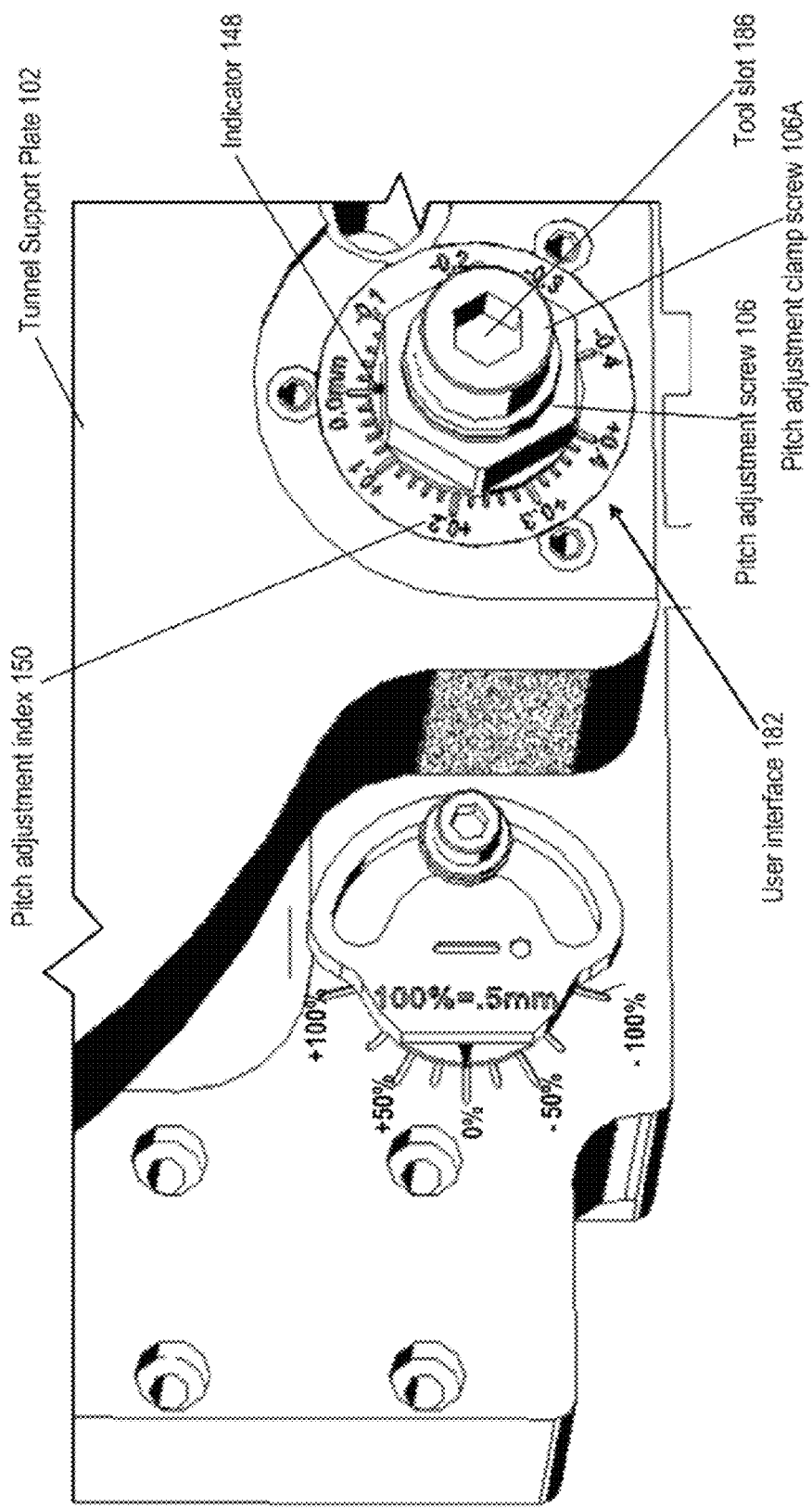
FIG. 1M, another view of FIG. 1E, shows a partial perspective view of the pitch adjustment user interface of the adjustment mechanism in accordance with one or more embodiments of the present invention.
Figure 1N:
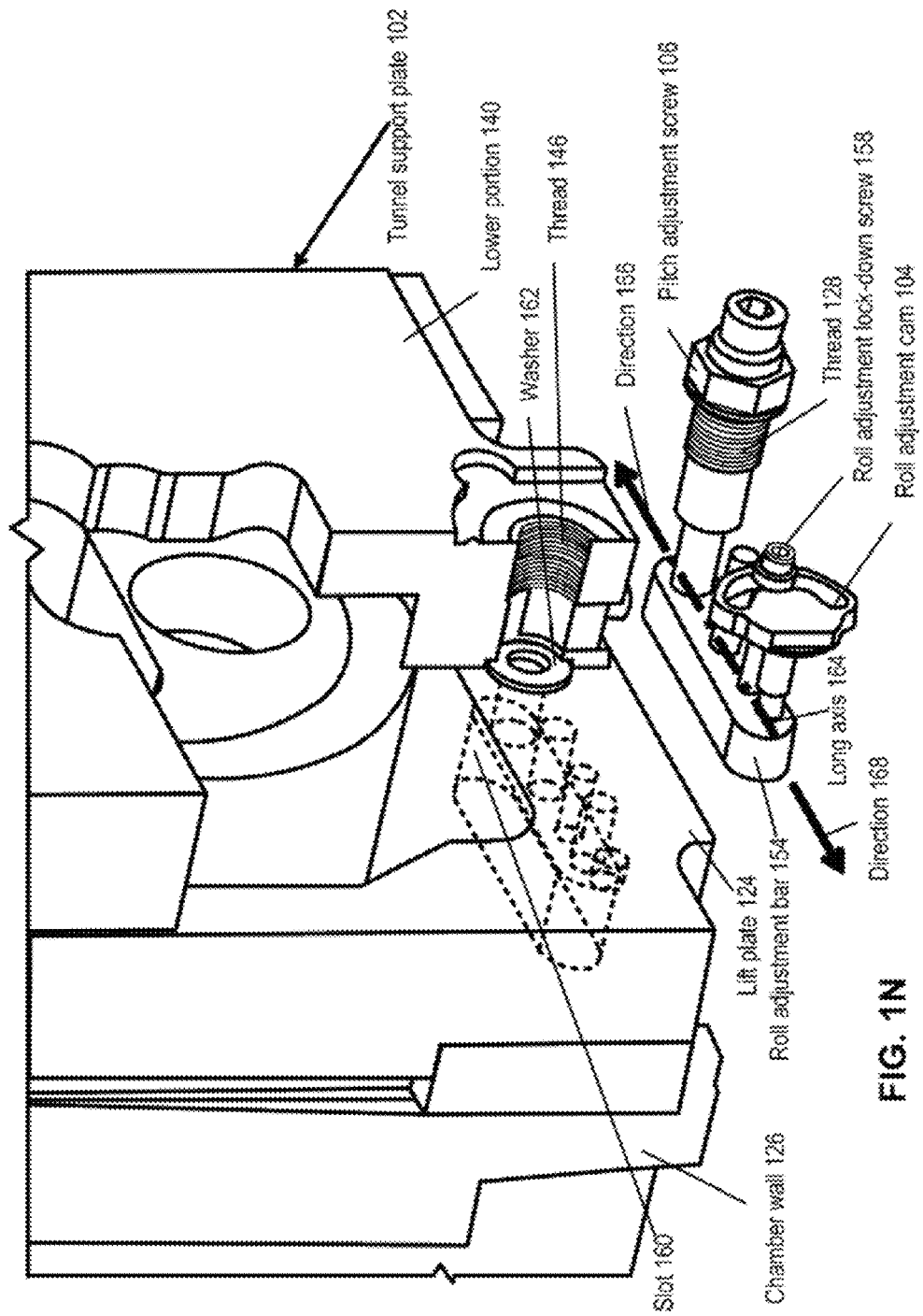
FIG. 1N, another view of FIG. 1F, shows a partial exploded view of the adjustment mechanism in accordance with one or more embodiments of the present invention.
Figure 10:
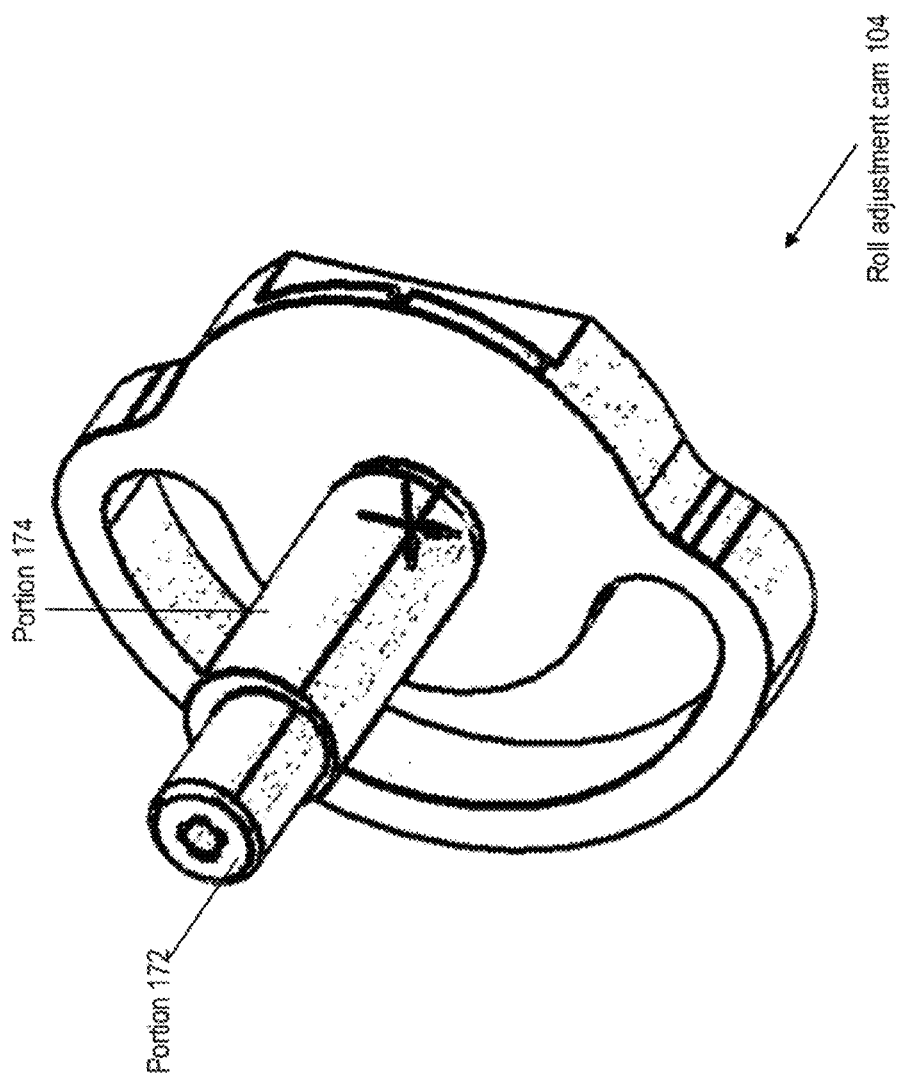
Figure 1P:
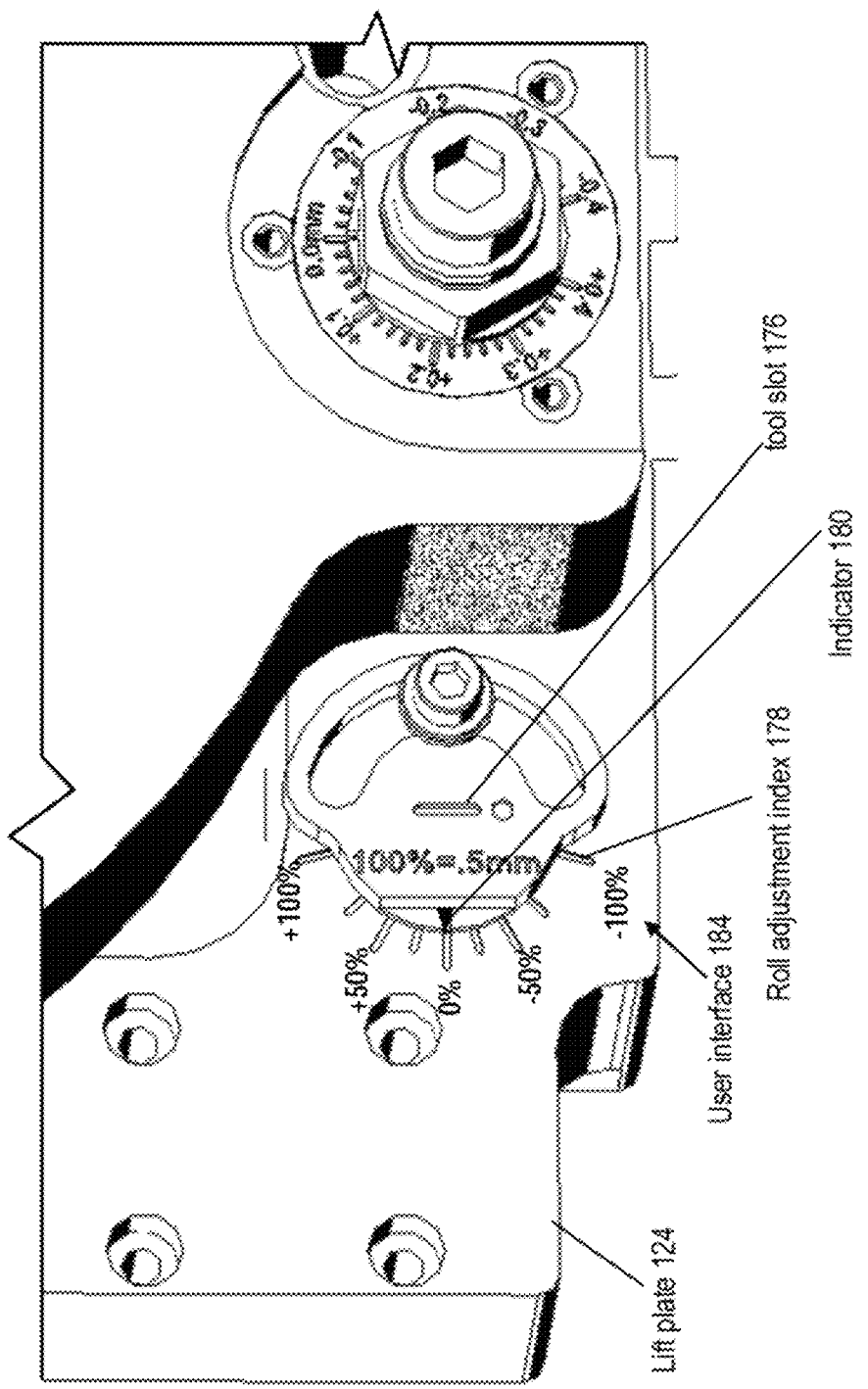
FIG. 1P, another view of FIG. 1H, shows a partial perspective view of the roll adjustment user interface of the adjustment mechanism in accordance with one or more embodiments of the present invention.

In one or more embodiments, support plate 302 may include a thread 346, and tube 306 may include a thread 338 that may engage thread 346. Turning tube 306 may enable translation of a portion 340 of support plate 302 relative to tube 306. The translation of portion 340 of support plate 302 may enable rotation of support plate 302 relative to chamber wall 326 for adjusting the electrode-to-electrode parallelism for plasma processing system 300. Plasma processing system 300 may also include an index 350 implemented on support plate 302 and an indicator (e.g., similar to indicator 148 shown in the examples of FIGS. 1E and 1M) implemented on tube 306 for providing visual feedback in adjusting the electrode-to-electrode parallelism.

One or more embodiments of the invention include one or more combinations of features discussed in one or more of the examples of FIGS. 1A-3. For example, an embodiment of the invention may be a plasma processing system including an electrical fan as discussed in the example of FIG. 2A and one or more rotation adjustment mechanisms as discussed in one or more of the examples of FIGS. 1A-1P. As another example, an embodiment of the invention may include multiple thermally resistive members/mechanisms discussed with references to the examples of FIGS. 2A-2F and FIG. 3.

As can be appreciated from the foregoing, in plasma processing systems, embodiments of the invention may provide low-thermal-conductivity coupling between components where needed and may provide high-thermal-conductivity coupling thermal coupling between components where needed, thereby optimizing operation of the components and extending the life spans of the components. For example, embodiments of the invention may include insulation members disposed between an electrode/chuck and its supporting member (e.g., a bias housing). Accordingly, the effect of the temperature change of the electrode may be limited to the electrode without substantially propagating to other components. As another example, embodiments of the invention may also include thermally resistive members serving as interfaces between a lift plate and a support plate. Accordingly, even if the change in the temperature of the electrode during plasma processing causes a substantial change in the temperature of the support plate, the temperature of the lift plate may still remain substantially constant. Advantageously, problems concerning unwanted thermal expansion and condensation may be minimized or prevented; therefore, components (e.g., mechanical components and electrical components) of the plasma processing system may be protected for desirable operation for a long time.

Embodiments of the invention may also include a fan for blowing ambient temperature air at the support plate, thereby minimizing temperature variations for the support plate and members coupled with the support plate (with good thermal coupling), such as a cantilever and the bias housing. Advantageously, the components of the plasma processing system may be further protected.

Embodiments of the invention may not require complicated, expensive beating and cooling arrangements or devices, such as electrical resistance heaters or coolant channels. Advantageously, manufacturing and maintenance costs may be minimized.

Embodiments of the invention may also include a mechanism for adjusting electrode-to-electrode parallelism. Since the temperature variations of components related to adjusting electrode-to-electrode parallelism are minimized, the electrode-to-electrode parallelism may be accurately configured and may be maintained without frequent calibration. Advantageously, efforts and costs for optimizing plasma processing may be minimized.

With low-cost parts, embodiments of the invention may allow fast adjustment and locking of parallelism to a precise level. Accordingly, embodiments of the invention may reduce the need for costly tight manufacturing tolerances on major components. Advantageously, embodiments of the invention may cost-effectively optimize process performance with regard to electrode parallelism.

Embodiments of the invention may enable precise electrode orientation/parallelism adjustment. Embodiments of the invention may also include calibrated index marks to give clear feedback of the amount of adjustment. Advantageously, the need for iterative adjusting and measuring required in the prior art may be eliminated.

Embodiments of the invention may allow the adjustment of electrode orientation and/or parallelism to take place while a plasma processing system is under vacuum, atmosphere, and/or in-situ, since the user interfaces are disposed outside the plasma processing chamber. Embodiments of the invention may also allow the adjustment to be made with minimum or no disassembly of the plasma processing system. Advantageously, system down time may be minimized, and productivity may not be compromised, while the needs for electrode orientation and/or parallelism adjustment are satisfied.

Embodiments of the invention may also enable locking the settings of electrode orientation/parallelism. An adjusted electrode orientation/parallelism setting may stay unchanged through normal vibrations and shipping loads. Advantageously, the resources (e.g., labor, time, etc.) required for the re-adjustment of electrode orientation/parallelism may be minimized.

While this invention has been described in terms of several embodiments, there are alterations, permutations, and equivalents, which fall within the scope of this invention. It should also be noted that there are many alternative ways of implementing the methods and apparatuses of the present invention. Furthermore, embodiments of the present invention may find utility in other applications. The abstract section may be provided herein for convenience and, due to word count limitation, may be accordingly written for reading convenience and should not be employed to limit the scope of the claims. It may be therefore intended that the following appended claims be interpreted as including all such alternations, permutations, and equivalents as fall within the true spirit and scope of the present invention.

What is claimed is:

1. A plasma processing system for processing at least a substrate, the plasma processing, system comprising:
    a plasma processing chamber including at least a chamber wall;
    an electrode disposed inside the plasma processing chamber and configured to support the substrate;
    a support member disposed inside the plasma processing chamber and configured to support the electrode;
    a support plate disposed outside the chamber wall;
    a cantilever disposed through the chamber wall and configured to couple the support member with the support plate;
    a lift plate disposed between the chamber wall and the support plate;
    one or more thermally resistive coupling mechanisms configured to mechanically couple the lift plate with the support plate, and a thermally resistive polygon pin, a first end of the thermally resistive polygon pin configured to be inserted into a round hole of the support plate; and
    a thermally resistive member configured to be inserted into the lift plate, a surface of the thermally resistive member configured to contact a second end of the thermally resistive polygon pin.

2. The plasma processing system of claim 1 wherein at least one of the thermally resistive polygon pin and the thermally resistive member is configured to determine a gap between the support plate and the lift plate.

3. The plasma processing system of claim 1 wherein the thermally resistive polygon pin represents at least one of a square pin and a hex pin.

4. The plasma processing system of claim 1 wherein the thermally resistive polygon pin represents a stainless steel pin, and the thermally resistive member represents a stainless steel insert.

5. The plasma processing system of claim 1 wherein the thermally resistive polygon pin and the thermally resistive member are configured to prevent direct contact between the support plate and lift plate and configured to smooth relative movement between the support plate and lift plate.

6. The plasma processing system of claim 1 further comprising:
    wherein at least one of the thermally resistive polygon pin and the thermally resistive member is configured to configure a gap between the support plate and the lift plate.

7. The plasma processing system of claim 1 wherein the one or more thermally resistive coupling mechanisms include one or more thermally insulative coupling mechanisms.

8. The plasma processing system of claim 1 wherein the one or more thermally resistive coupling mechanisms include one or more coupling mechanisms made of stainless steel.

9. The plasma processing system of claim 1 wherein the one or more thermally resistive coupling mechanisms include at least a thermally resistive pivot mechanism, the thermally resistive pivot mechanism configured to facilitate the support plate to rotate with respect to the chamber wall.

10. The plasma processing system of claim 1 further comprising a fan configured to blow air toward the support plate, wherein the support plate is disposed between the chamber wall and the fan.

11. The plasma processing system of claim 10 wherein the support plate includes a plurality of ridges disposed facing the fan and configured to maximize a surface area of the support plate.

12. The plasma processing system of claim 1 further comprising one or more bearings coupled with the lift plate and coupled with the chamber wall, the one or more bearings configured to guide at least translation of at least a portion of the support plate.

13. The plasma processing system of claim 1 further comprising:
an insulative ring disposed between the support member and the electrode;
a first o-ring disposed between the insulative ring and the electrode; and
a second o-ring disposed between the insulative ring and the support member.

14. The plasma processing system of claim 13 wherein an outer diameter of the first o-ring is minimized, to maximize a vacuum interface between the insulative ring and the electrode.

15. The plasma processing system of claim 13 wherein an outer diameter of the second o-ring is minimized to maximize a vacuum interface between the insulative ring and the support member.

16. A plasma processing, system for processing at least a substrate, the plasma processing system comprising:
a plasma processing chamber including at least as chamber wall;
an electrode disposed inside the plasma processing chamber and configured to support the substrate;
a support member disposed inside the plasma processing chamber and configured to support the electrode;
a lift plate disposed between the chamber wall and the support plate;
a support plate disposed outside the chamber wall and pivotally connected thereto for allowing rotation of the support plate relative to the lift plate and the chamber wall;
a cantilever disposed through the chamber wall and configured to couple the support member with the support plate;
one or more thermally resistive coupling mechanisms configured to mechanically couple the lift plate with the support plate and for providing thermal isolation between the lift plate and support plate;
a thermally resistive polygon pin, a first end of the thermally resistive polygon pin configured to be inserted into a round hole of the support plate; and
a thermally resistive member configured to be inserted into the lift plate, a surface of the thermally resistive member configured to contact a second end of the thermally resistive polygon pin.

* * * * *